(12) United States Patent
Stiff

(10) Patent No.: US 8,085,067 B1
(45) Date of Patent: Dec. 27, 2011

(54) DIFFERENTIAL-TO-SINGLE ENDED SIGNAL CONVERTER CIRCUIT AND METHOD

(75) Inventor: Jonathon Stiff, Moscow, ID (US)

(73) Assignee: Cypress Semiconductor Corporation, San Jose, CA (US)

( * ) Notice: Subject to any disclaimer, the term of this patent is extended or adjusted under 35 U.S.C. 154(b) by 21 days.

(21) Appl. No.: 11/644,100

(22) Filed: Dec. 21, 2006

Related U.S. Application Data

(60) Provisional application No. 60/752,804, filed on Dec. 21, 2005.

(51) Int. Cl.
*G11C 7/06* (2006.01)

(52) U.S. Cl. ............... 327/51; 327/52; 327/63; 327/65; 330/252; 330/253

(58) Field of Classification Search ........... 327/51–53, 327/55, 57, 63–66, 108–112; 330/252, 253, 330/261; 326/82–83
See application file for complete search history.

(56) References Cited

U.S. PATENT DOCUMENTS

| | | |
|---|---|---|
| 3,378,877 A | 4/1968 | Perry et al. |
| 3,600,690 A | 8/1971 | White |
| 3,725,804 A | 4/1973 | Langan |
| 3,740,588 A | 6/1973 | Stratton et al. |
| 3,810,036 A | 5/1974 | Bloedorn |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |

(Continued)

FOREIGN PATENT DOCUMENTS

DE 19710829 A1 9/1998

(Continued)

OTHER PUBLICATIONS

U.S. Appl. No. 11/132,894, Stiff, Jonathon.

(Continued)

*Primary Examiner* — An T Luu

(57) ABSTRACT

A differential-to-single ended converter circuit can include a latching circuit having first and second latch field effect transistors (FETs) with drains and gates cross-coupled between a first latch node and a second latch node. The source-drain paths of the first and second latch FETs are coupled to a first reference potential node via separate current paths. A sense circuit can include a first sense FET having a source-drain path coupled between the first sense node and the first reference potential node, and a gate coupled to a first input node. A second sense FET has a source-drain path coupled between the second sense node and the first reference potential node, and a gate coupled to a second input node. An output circuit can have a first output FET with a source-drain path coupled between a first output supply node and an output signal node, and a gate coupled to the first latch node, and a second output FET with a source-drain path coupled between the output signal node and a second output supply node.

14 Claims, 5 Drawing Sheets

U.S. PATENT DOCUMENTS

| | | |
|---|---|---|
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,973,864 A * | 11/1990 | Nogami ........................ 327/55 |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,095,284 A | 3/1992 | Mead |
| 5,097,305 A | 3/1992 | Mead et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada et al. |
| 5,144,582 A | 9/1992 | Steele |
| 5,146,106 A | 9/1992 | Anderson et al. |
| 5,150,079 A | 9/1992 | Williams et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerphide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosetto |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Lewis et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,408,235 A | 4/1995 | Doyle et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |

| Patent | Date | Inventor |
|---|---|---|
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |
| 5,438,672 A | 8/1995 | Dey |
| 5,440,305 A | 8/1995 | Signore et al. |
| 5,451,887 A | 9/1995 | El-Avat et al. |
| 5,453,904 A | 9/1995 | Higashiyama et al. |
| 5,455,525 A | 10/1995 | Ho et al. |
| 5,455,731 A | 10/1995 | Parkinson |
| 5,455,927 A | 10/1995 | Huang |
| 5,457,410 A | 10/1995 | Ting |
| 5,457,479 A | 10/1995 | Cheng |
| 5,463,591 A | 10/1995 | Aimoto et al. |
| 5,479,603 A | 12/1995 | Stone et al. |
| 5,479,652 A | 12/1995 | Dreyer et al. |
| 5,481,471 A | 1/1996 | Naglestad |
| 5,488,204 A | 1/1996 | Mead et al. |
| 5,491,458 A | 2/1996 | McCune |
| 5,493,246 A | 2/1996 | Anderson |
| 5,493,723 A | 2/1996 | Beck et al. |
| 5,495,077 A | 2/1996 | Miller et al. |
| 5,495,593 A | 2/1996 | Elmer et al. |
| 5,495,594 A | 2/1996 | MacKenna et al. |
| 5,499,192 A | 3/1996 | Knapp et al. |
| 5,517,198 A | 5/1996 | McEwan |
| 5,519,854 A | 5/1996 | Watt |
| 5,521,529 A | 5/1996 | Agrawal et al. |
| 5,530,444 A | 6/1996 | Tice et al. |
| 5,530,673 A | 6/1996 | Tobita et al. |
| 5,530,813 A | 6/1996 | Paulsen et al. |
| 5,537,057 A | 7/1996 | Leong et al. |
| 5,541,878 A | 7/1996 | LeMoncheck et al. |
| 5,542,055 A | 7/1996 | Amini et al. |
| 5,543,588 A | 8/1996 | Bisset et al. |
| 5,543,590 A | 8/1996 | Gillespie et al. |
| 5,543,591 A | 8/1996 | Gillespie et al. |
| 5,544,311 A | 8/1996 | Harenberg et al. |
| 5,546,433 A | 8/1996 | Tran et al. |
| 5,546,562 A | 8/1996 | Patel |
| 5,552,725 A | 9/1996 | Ray et al. |
| 5,552,748 A | 9/1996 | O'Shaughnessy |
| 5,554,951 A | 9/1996 | Gough |
| 5,555,452 A | 9/1996 | Callaway et al. |
| 5,555,907 A | 9/1996 | Philipp |
| 5,557,762 A | 9/1996 | Okuaki et al. |
| 5,559,502 A | 9/1996 | Schutte |
| 5,559,996 A | 9/1996 | Fujioka et al. |
| 5,563,526 A | 10/1996 | Hastings et al. |
| 5,563,529 A | 10/1996 | Seltzer et al. |
| 5,564,010 A | 10/1996 | Henry et al. |
| 5,564,108 A | 10/1996 | Hunsaker et al. |
| 5,565,658 A | 10/1996 | Gerpheide et al. |
| 5,566,702 A | 10/1996 | Philipp |
| 5,572,665 A | 11/1996 | Nakabayashi et al. |
| 5,572,719 A | 11/1996 | Biesterfeldt |
| 5,574,678 A | 11/1996 | Gorecki |
| 5,574,852 A | 11/1996 | Bakker et al. |
| 5,574,892 A | 11/1996 | Christensen |
| 5,579,353 A | 11/1996 | Parmenter et al. |
| 5,587,945 A | 12/1996 | Lin et al. |
| 5,587,957 A | 12/1996 | Kowalczyk et al. |
| 5,590,354 A | 12/1996 | Klapproth et al. |
| 5,594,388 A | 1/1997 | O'Shaughnessy et al. |
| 5,594,734 A | 1/1997 | Worsley et al. |
| 5,594,876 A | 1/1997 | Getzlaff et al. |
| 5,594,890 A | 1/1997 | Yamaura et al. |
| 5,600,262 A | 2/1997 | Kolze |
| 5,604,466 A | 2/1997 | Dreps et al. |
| 5,608,892 A | 3/1997 | Wakerly |
| 5,625,316 A | 4/1997 | Chambers et al. |
| 5,625,583 A | 4/1997 | Hyatt |
| 5,629,857 A | 5/1997 | Brennan |
| 5,629,891 A | 5/1997 | LeMoncheck et al. |
| 5,630,052 A | 5/1997 | Shah |
| 5,630,057 A | 5/1997 | Hait |
| 5,630,102 A | 5/1997 | Johnson et al. |
| 5,631,577 A | 5/1997 | Freidin et al. |
| 5,633,766 A | 5/1997 | Hase et al. |
| 5,642,295 A | 6/1997 | Smayling |
| 5,646,544 A | 7/1997 | Iadanza |
| 5,646,901 A | 7/1997 | Sharpe-Geisler et al. |
| 5,648,642 A | 7/1997 | Miller et al. |
| 5,651,035 A | 7/1997 | Tozun |
| 5,652,893 A | 7/1997 | Ben-Meir et al. |
| 5,661,433 A | 8/1997 | LaRosa et al. |
| 5,663,900 A | 9/1997 | Bhandari et al. |
| 5,663,965 A | 9/1997 | Seymour |
| 5,664,199 A | 9/1997 | Kuwahara |
| 5,670,915 A | 9/1997 | Cooper et al. |
| 5,673,198 A | 9/1997 | Lawman et al. |
| 5,675,825 A | 10/1997 | Dreyer et al. |
| 5,677,691 A | 10/1997 | Hosticka et al. |
| 5,680,070 A | 10/1997 | Anderson et al. |
| 5,682,032 A | 10/1997 | Philipp |
| 5,684,434 A | 11/1997 | Mann et al. |
| 5,684,952 A | 11/1997 | Stein |
| 5,686,844 A | 11/1997 | Hull et al. |
| 5,687,325 A | 11/1997 | Chang |
| 5,689,195 A | 11/1997 | Cliff et al. |
| 5,689,196 A | 11/1997 | Schutte |
| 5,691,664 A | 11/1997 | Anderson et al. |
| 5,691,898 A | 11/1997 | Rosenberg et al. |
| 5,694,063 A | 12/1997 | Burlison et al. |
| 5,696,952 A | 12/1997 | Pontarelli |
| 5,699,024 A | 12/1997 | Manlove et al. |
| 5,703,871 A | 12/1997 | Pope et al. |
| 5,706,453 A | 1/1998 | Cheng et al. |
| 5,708,798 A | 1/1998 | Lynch et al. |
| 5,710,906 A | 1/1998 | Ghosh et al. |
| 5,712,969 A | 1/1998 | Zimmermann et al. |
| 5,721,931 A | 2/1998 | Gephardt et al. |
| 5,724,009 A | 3/1998 | Collins et al. |
| 5,727,170 A | 3/1998 | Mitchell et al. |
| 5,728,933 A | 3/1998 | Schultz et al. |
| 5,729,704 A | 3/1998 | Stone et al. |
| 5,730,165 A | 3/1998 | Philipp |
| 5,732,277 A | 3/1998 | Kodosky et al. |
| 5,734,272 A | 3/1998 | Belot et al. |
| 5,734,334 A | 3/1998 | Hsieh et al. |
| 5,737,557 A | 4/1998 | Sullivan |
| 5,737,760 A | 4/1998 | Grimmer et al. |
| 5,745,011 A | 4/1998 | Scott |
| 5,748,048 A | 5/1998 | Moyal |
| 5,748,875 A | 5/1998 | Tzori |
| 5,752,013 A | 5/1998 | Christensen et al. |
| 5,754,552 A | 5/1998 | Allmond et al. |
| 5,754,826 A | 5/1998 | Gamal et al. |
| 5,757,368 A | 5/1998 | Gerpheide et al. |
| 5,758,058 A | 5/1998 | Milburn |
| 5,761,128 A | 6/1998 | Watanabe |
| 5,763,909 A | 6/1998 | Mead et al. |
| 5,764,714 A | 6/1998 | Stansell et al. |
| 5,767,457 A | 6/1998 | Gerpheide et al. |
| 5,774,704 A | 6/1998 | Williams |
| 5,777,399 A | 7/1998 | Shibuya |
| 5,781,030 A | 7/1998 | Agrawal et al. |
| 5,781,747 A | 7/1998 | Kametani |
| 5,784,545 A | 7/1998 | Anderson et al. |
| 5,790,957 A | 8/1998 | Heidari |
| 5,796,183 A | 8/1998 | Hourmand |
| 5,799,176 A | 8/1998 | Kapusta et al. |
| 5,801,958 A | 9/1998 | Dangelo et al. |
| 5,802,073 A | 9/1998 | Platt |
| 5,802,290 A | 9/1998 | Casselman |
| 5,805,792 A | 9/1998 | Swoboda et al. |
| 5,805,897 A | 9/1998 | Glowny |
| 5,808,883 A | 9/1998 | Hawkes |
| 5,811,987 A | 9/1998 | Ashmore, Jr. et al. |
| 5,812,698 A | 9/1998 | Platt et al. |
| 5,818,254 A | 10/1998 | Agrawal et al. |
| 5,818,444 A | 10/1998 | Alimpich et al. |
| 5,818,736 A | 10/1998 | Leibold |
| 5,819,028 A | 10/1998 | Manghirmalani et al. |
| 5,822,387 A | 10/1998 | Mar |

| | | | | | |
|---|---|---|---|---|---|
| 5,822,531 A | 10/1998 | Gorczyca et al. | 5,969,513 A | 10/1999 | Clark |
| 5,828,693 A | 10/1998 | Mays et al. | 5,969,632 A | 10/1999 | Diamant et al. |
| 5,838,583 A | 11/1998 | Varadarajan et al. | 5,973,368 A | 10/1999 | Pearce et al. |
| 5,841,078 A | 11/1998 | Miller et al. | 5,974,235 A | 10/1999 | Nunally et al. |
| 5,841,996 A | 11/1998 | Nolan et al. | 5,977,791 A | 11/1999 | Veenstra |
| 5,844,265 A | 12/1998 | Mead et al. | 5,978,584 A | 11/1999 | Nishibata et al. |
| 5,844,437 A * | 12/1998 | Asazawa et al. ............... 327/202 | 5,978,937 A | 11/1999 | Miyamori et al. |
| 5,848,285 A | 12/1998 | Kapusta et al. | 5,982,105 A | 11/1999 | Masters |
| 5,850,156 A | 12/1998 | Wittman | 5,982,229 A | 11/1999 | Wong et al. |
| 5,852,733 A | 12/1998 | Chien et al. | 5,982,241 A | 11/1999 | Nguyen et al. |
| 5,854,625 A | 12/1998 | Frisch et al. | 5,983,277 A | 11/1999 | Heile et al. |
| 5,857,109 A | 1/1999 | Taylor | 5,986,479 A | 11/1999 | Mohan |
| 5,861,583 A | 1/1999 | Schediwy et al. | 5,987,246 A | 11/1999 | Thomsen et al. |
| 5,861,875 A | 1/1999 | Gerpheide | 5,988,902 A | 11/1999 | Holehan |
| 5,864,242 A | 1/1999 | Allen et al. | 5,994,939 A | 11/1999 | Johnson et al. |
| 5,864,392 A | 1/1999 | Winklhofer et al. | 5,996,032 A | 11/1999 | Baker |
| 5,867,046 A | 2/1999 | Sugasawa | 5,999,725 A | 12/1999 | Barbier et al. |
| 5,867,399 A | 2/1999 | Rostoker et al. | 6,002,268 A | 12/1999 | Sasaki et al. |
| 5,869,979 A | 2/1999 | Bocchino | 6,002,398 A | 12/1999 | Wilson |
| 5,870,004 A | 2/1999 | Lu | 6,003,054 A | 12/1999 | Oshima et al. |
| 5,870,309 A | 2/1999 | Lawman | 6,003,107 A | 12/1999 | Ranson et al. |
| 5,870,345 A | 2/1999 | Stecker | 6,003,133 A | 12/1999 | Moughanni et al. |
| 5,872,464 A | 2/1999 | Gradinariu | 6,005,814 A | 12/1999 | Mulholland et al. |
| 5,874,958 A | 2/1999 | Ludolph | 6,005,904 A | 12/1999 | Knapp et al. |
| 5,875,293 A | 2/1999 | Bell et al. | 6,008,685 A | 12/1999 | Kunst |
| 5,877,656 A | 3/1999 | Mann et al. | 6,008,703 A | 12/1999 | Perrott et al. |
| 5,878,425 A | 3/1999 | Redpath | 6,009,270 A | 12/1999 | Mann |
| 5,880,411 A | 3/1999 | Gillespie et al. | 6,009,496 A | 12/1999 | Tsai |
| 5,880,598 A | 3/1999 | Duong | 6,011,407 A | 1/2000 | New |
| 5,883,623 A | 3/1999 | Cseri | 6,012,835 A | 1/2000 | Thompson et al. |
| 5,886,582 A | 3/1999 | Stansell | 6,014,135 A | 1/2000 | Fernandes |
| 5,887,189 A | 3/1999 | Birns et al. | 6,014,509 A | 1/2000 | Furtek et al. |
| 5,889,236 A | 3/1999 | Gillespie et al. | 6,016,554 A | 1/2000 | Skrovan et al. |
| 5,889,723 A | 3/1999 | Pascucci | 6,016,563 A | 1/2000 | Fleisher |
| 5,889,988 A | 3/1999 | Held | 6,018,559 A | 1/2000 | Azegami et al. |
| 5,894,226 A | 4/1999 | Koyama | 6,023,422 A | 2/2000 | Allen et al. |
| 5,894,243 A | 4/1999 | Hwang | 6,023,565 A | 2/2000 | Lawman et al. |
| 5,894,565 A | 4/1999 | Furtek et al. | 6,026,134 A | 2/2000 | Duffy et al. |
| 5,895,494 A | 4/1999 | Scalzi et al. | 6,026,501 A | 2/2000 | Hohl et al. |
| 5,896,068 A | 4/1999 | Moyal | 6,028,271 A | 2/2000 | Gillespie et al. |
| 5,896,330 A | 4/1999 | Gibson | 6,028,959 A | 2/2000 | Wang et al. |
| 5,898,345 A | 4/1999 | Namura et al. | 6,031,365 A | 2/2000 | Sharpe-Geisler |
| 5,900,780 A | 5/1999 | Hirose et al. | 6,032,268 A | 2/2000 | Swoboda et al. |
| 5,901,062 A | 5/1999 | Burch et al. | 6,034,538 A | 3/2000 | Abramovici |
| 5,903,718 A | 5/1999 | Marik | 6,035,320 A | 3/2000 | Kiriaki et al. |
| 5,905,398 A | 5/1999 | Todsen et al. | 6,037,807 A * | 3/2000 | Wu et al. ......................... 327/52 |
| 5,909,544 A | 6/1999 | Anderson, II et al. | 6,038,551 A | 3/2000 | Barlow et al. |
| 5,911,059 A | 6/1999 | Profit, Jr. | 6,041,406 A | 3/2000 | Mann |
| 5,914,465 A | 6/1999 | Allen et al. | 6,043,695 A | 3/2000 | O'Sullivan |
| 5,914,633 A | 6/1999 | Comino et al. | 6,043,719 A | 3/2000 | Lin et al. |
| 5,914,708 A | 6/1999 | LaGrange et al. | 6,049,223 A | 4/2000 | Lytle et al. |
| 5,917,356 A | 6/1999 | Casal et al. | 6,049,225 A | 4/2000 | Huang et al. |
| 5,920,310 A | 7/1999 | Faggin et al. | 6,051,772 A | 4/2000 | Cameron et al. |
| 5,923,264 A | 7/1999 | Lavelle et al. | 6,052,035 A | 4/2000 | Nolan et al. |
| 5,926,566 A | 7/1999 | Wang et al. | 6,052,524 A | 4/2000 | Pauna |
| 5,929,710 A | 7/1999 | Bien | 6,055,584 A | 4/2000 | Bridges et al. |
| 5,930,148 A | 7/1999 | Bjorksten et al. | 6,057,705 A | 5/2000 | Wojewoda et al. |
| 5,930,150 A | 7/1999 | Cohen et al. | 6,058,263 A | 5/2000 | Voth |
| 5,931,959 A | 8/1999 | Kwiat | 6,058,452 A | 5/2000 | Rangasayee et al. |
| 5,933,023 A | 8/1999 | Young | 6,061,511 A | 5/2000 | Marantz et al. |
| 5,933,356 A | 8/1999 | Rostoker et al. | 6,066,961 A | 5/2000 | Lee et al. |
| 5,933,816 A | 8/1999 | Zeanah et al. | 6,070,003 A | 5/2000 | Gove et al. |
| 5,935,266 A | 8/1999 | Thurnhofer et al. | 6,072,803 A | 6/2000 | Allmond et al. |
| 5,939,904 A | 8/1999 | Fetterman et al. | 6,075,941 A | 6/2000 | Itoh et al. |
| 5,939,949 A | 8/1999 | Olgaard et al. | 6,079,985 A | 6/2000 | Wohl et al. |
| 5,941,991 A | 8/1999 | Kageshima | 6,081,140 A | 6/2000 | King |
| 5,942,733 A | 8/1999 | Allen et al. | 6,088,822 A | 7/2000 | Warren |
| 5,943,052 A | 8/1999 | Allen et al. | 6,094,730 A | 7/2000 | Lopez et al. |
| 5,945,878 A | 8/1999 | Westwick et al. | 6,097,211 A | 8/2000 | Couts-Martin et al. |
| 5,949,632 A | 9/1999 | Barreras, Sr. et al. | 6,097,432 A | 8/2000 | Mead et al. |
| 5,952,888 A | 9/1999 | Scott | 6,101,457 A | 8/2000 | Barch et al. |
| 5,959,871 A | 9/1999 | Pierzchala et al. | 6,101,617 A | 8/2000 | Burckhartt et al. |
| 5,963,075 A | 10/1999 | Hiiragizawa | 6,104,217 A | 8/2000 | Magana |
| 5,963,105 A | 10/1999 | Nguyen | 6,104,325 A | 8/2000 | Liaw et al. |
| 5,963,503 A | 10/1999 | Lee | 6,107,826 A | 8/2000 | Young et al. |
| 5,964,893 A | 10/1999 | Circello et al. | 6,107,882 A | 8/2000 | Gabara et al. |
| 5,966,027 A | 10/1999 | Kapusta et al. | 6,110,223 A | 8/2000 | Southgate et al. |
| 5,966,532 A | 10/1999 | McDonald et al. | 6,111,431 A | 8/2000 | Estrada |
| 5,968,135 A | 10/1999 | Teramoto et al. | 6,112,264 A | 8/2000 | Beasley et al. |

| | | |
|---|---|---|
| 6,121,791 A | 9/2000 | Abbott |
| 6,121,805 A | 9/2000 | Thamsirianunt et al. |
| 6,121,965 A | 9/2000 | Kenney et al. |
| 6,125,416 A | 9/2000 | Warren |
| 6,130,548 A | 10/2000 | Koifman |
| 6,130,551 A | 10/2000 | Agrawal et al. |
| 6,130,552 A | 10/2000 | Jefferson et al. |
| 6,133,773 A | 10/2000 | Garlepp et al. |
| 6,134,181 A | 10/2000 | Landry |
| 6,134,516 A | 10/2000 | Wang et al. |
| 6,137,308 A | 10/2000 | Nayak |
| 6,141,376 A | 10/2000 | Shaw |
| 6,141,764 A | 10/2000 | Ezell |
| 6,144,327 A | 11/2000 | Distinti et al. |
| 6,148,104 A | 11/2000 | Wang et al. |
| 6,148,441 A | 11/2000 | Woodward |
| 6,149,299 A | 11/2000 | Aslan et al. |
| 6,150,866 A | 11/2000 | Eto et al. |
| 6,154,064 A * | 11/2000 | Proebsting .............. 327/55 |
| 6,157,024 A | 12/2000 | Chapdelaine et al. |
| 6,157,270 A | 12/2000 | Tso |
| 6,161,199 A | 12/2000 | Szeto et al. |
| 6,166,367 A | 12/2000 | Cho |
| 6,166,960 A | 12/2000 | Marneweck et al. |
| 6,167,077 A | 12/2000 | Ducaroir |
| 6,167,364 A | 12/2000 | Stellenberg et al. |
| 6,167,559 A | 12/2000 | Furtek et al. |
| 6,172,428 B1 | 1/2001 | Jordan |
| 6,172,571 B1 | 1/2001 | Moyal et al. |
| 6,173,419 B1 | 1/2001 | Barnett |
| 6,175,914 B1 | 1/2001 | Mann |
| 6,175,949 B1 | 1/2001 | Gristede et al. |
| 6,181,163 B1 | 1/2001 | Agrawal et al. |
| 6,183,131 B1 | 2/2001 | Holloway et al. |
| 6,185,127 B1 | 2/2001 | Myers et al. |
| 6,185,450 B1 | 2/2001 | Seguine et al. |
| 6,185,522 B1 | 2/2001 | Bakker |
| 6,185,703 B1 | 2/2001 | Guddat et al. |
| 6,185,732 B1 | 2/2001 | Mann et al. |
| 6,188,228 B1 | 2/2001 | Philipp |
| 6,188,241 B1 | 2/2001 | Gauthier et al. |
| 6,188,381 B1 | 2/2001 | van der Wal et al. |
| 6,188,391 B1 | 2/2001 | Seely et al. |
| 6,188,975 B1 | 2/2001 | Gay |
| 6,191,603 B1 | 2/2001 | Muradali et al. |
| 6,191,660 B1 | 2/2001 | Mar et al. |
| 6,191,998 B1 | 2/2001 | Reddy et al. |
| 6,192,431 B1 | 2/2001 | Dabral et al. |
| 6,198,303 B1 | 3/2001 | Rangasayee |
| 6,201,407 B1 | 3/2001 | Kapusta et al. |
| 6,201,829 B1 | 3/2001 | Schneider |
| 6,202,044 B1 | 3/2001 | Tzori |
| 6,204,687 B1 | 3/2001 | Schultz et al. |
| 6,208,572 B1 | 3/2001 | Adams et al. |
| 6,211,708 B1 | 4/2001 | Kemmer |
| 6,211,715 B1 | 4/2001 | Terauchi |
| 6,211,741 B1 | 4/2001 | Dalmia |
| 6,215,352 B1 | 4/2001 | Sudo |
| 6,216,254 B1 | 4/2001 | Pesce et al. |
| 6,219,729 B1 | 4/2001 | Keats et al. |
| 6,222,528 B1 | 4/2001 | Gerpheide et al. |
| 6,223,144 B1 | 4/2001 | Barnett et al. |
| 6,223,147 B1 | 4/2001 | Bowers |
| 6,223,272 B1 | 4/2001 | Coehlo et al. |
| RE37,195 E | 5/2001 | Kean |
| 6,225,866 B1 | 5/2001 | Kubota et al. |
| 6,236,242 B1 | 5/2001 | Hedberg |
| 6,236,275 B1 | 5/2001 | Dent |
| 6,236,278 B1 | 5/2001 | Olgaard |
| 6,236,593 B1 | 5/2001 | Hong et al. |
| 6,239,389 B1 | 5/2001 | Allen et al. |
| 6,239,798 B1 | 5/2001 | Ludolph et al. |
| 6,240,375 B1 | 5/2001 | Sonoda |
| 6,246,258 B1 | 6/2001 | Lesea |
| 6,246,410 B1 | 6/2001 | Bergeron et al. |
| 6,249,167 B1 | 6/2001 | Oguchi et al. |
| 6,249,447 B1 | 6/2001 | Boylan et al. |
| 6,253,250 B1 | 6/2001 | Evans et al. |
| 6,253,754 B1 | 7/2001 | Ward |
| 6,262,717 B1 | 7/2001 | Donohue et al. |
| 6,263,302 B1 | 7/2001 | Hellestrand et al. |
| 6,263,339 B1 | 7/2001 | Hirsch |
| 6,263,484 B1 | 7/2001 | Yang |
| 6,268,752 B1 * | 7/2001 | Takahashi et al. .............. 327/202 |
| 6,269,383 B1 | 7/2001 | Sabin et al. |
| 6,271,679 B1 | 8/2001 | McClintock et al. |
| 6,275,117 B1 | 8/2001 | Abugharbieh et al. |
| 6,278,568 B1 | 8/2001 | Cloke et al. |
| 6,280,391 B1 | 8/2001 | Olson et al. |
| 6,281,753 B1 | 8/2001 | Corsi et al. |
| 6,282,547 B1 | 8/2001 | Hirsch |
| 6,282,551 B1 | 8/2001 | Anderson et al. |
| 6,286,127 B1 | 9/2001 | King et al. |
| 6,288,707 B1 | 9/2001 | Philipp |
| 6,289,300 B1 | 9/2001 | Brannick et al. |
| 6,289,478 B1 | 9/2001 | Kitagaki |
| 6,289,489 B1 | 9/2001 | Bold et al. |
| 6,292,028 B1 | 9/2001 | Tomita |
| 6,294,932 B1 | 9/2001 | Watarai |
| 6,294,962 B1 | 9/2001 | Mar |
| 6,298,320 B1 | 10/2001 | Buckmaster et al. |
| 6,304,014 B1 | 10/2001 | England et al. |
| 6,304,101 B1 | 10/2001 | Nishihara |
| 6,304,790 B1 | 10/2001 | Nakamura et al. |
| 6,307,413 B1 | 10/2001 | Dalmia et al. |
| 6,310,521 B1 | 10/2001 | Dalmia |
| 6,310,611 B1 | 10/2001 | Caldwell |
| 6,311,149 B1 | 10/2001 | Ryan et al. |
| 6,314,530 B1 | 11/2001 | Mann |
| 6,320,184 B1 | 11/2001 | Winklhofer et al. |
| 6,320,282 B1 | 11/2001 | Caldwell |
| 6,321,369 B1 | 11/2001 | Heile et al. |
| 6,323,846 B1 | 11/2001 | Westerman et al. |
| 6,324,628 B1 | 11/2001 | Chan |
| 6,326,859 B1 | 12/2001 | Goldman et al. |
| 6,332,137 B1 | 12/2001 | Hori et al. |
| 6,332,201 B1 | 12/2001 | Chin et al. |
| 6,337,579 B1 | 1/2002 | Mochida |
| 6,339,815 B1 | 1/2002 | Feng et al. |
| 6,342,907 B1 | 1/2002 | Petty et al. |
| 6,345,383 B1 | 2/2002 | Ueki |
| 6,347,395 B1 | 2/2002 | Payne et al. |
| 6,351,789 B1 | 2/2002 | Green |
| 6,353,452 B1 | 3/2002 | Hamada et al. |
| 6,355,980 B1 | 3/2002 | Callahan |
| 6,356,862 B2 | 3/2002 | Bailey |
| 6,356,958 B1 | 3/2002 | Lin |
| 6,356,960 B1 | 3/2002 | Jones et al. |
| 6,359,950 B2 | 3/2002 | Gossmann et al. |
| 6,362,697 B1 | 3/2002 | Pulvirenti |
| 6,366,174 B1 | 4/2002 | Berry et al. |
| 6,366,300 B1 | 4/2002 | Ohara et al. |
| 6,366,874 B1 | 4/2002 | Lee et al. |
| 6,366,878 B1 | 4/2002 | Grunert |
| 6,371,878 B1 | 4/2002 | Bowen |
| 6,373,954 B1 | 4/2002 | Malcolm et al. |
| 6,374,370 B1 | 4/2002 | Bockhaus et al. |
| 6,377,009 B1 | 4/2002 | Philipp |
| 6,377,575 B1 | 4/2002 | Mullaney et al. |
| 6,377,646 B1 | 4/2002 | Sha |
| 6,380,811 B1 | 4/2002 | Zarubinsky et al. |
| 6,380,929 B1 | 4/2002 | Platt |
| 6,380,931 B1 | 4/2002 | Gillespie et al. |
| 6,384,947 B1 | 5/2002 | Ackerman et al. |
| 6,385,742 B1 | 5/2002 | Kirsch et al. |
| 6,388,109 B1 | 5/2002 | Schwarz et al. |
| 6,388,464 B1 | 5/2002 | Lacey et al. |
| 6,396,302 B2 | 5/2002 | New et al. |
| 6,396,657 B1 | 5/2002 | Sun et al. |
| 6,397,232 B1 | 5/2002 | Cheng-Hung et al. |
| 6,401,230 B1 | 6/2002 | Ahanessians et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |

| Patent No. | Date | Inventor |
|---|---|---|
| 6,421,698 B1 | 7/2002 | Hong |
| 6,421,817 B1 | 7/2002 | Mohan et al. |
| 6,425,109 B1 | 7/2002 | Choukalos et al. |
| 6,429,882 B1 | 8/2002 | Abdelnur et al. |
| 6,430,305 B1 | 8/2002 | Decker |
| 6,433,645 B1 | 8/2002 | Mann et al. |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Insenser Farre et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Bergamashi/Rab et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,969 B2 | 12/2002 | Feng et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,677,932 B1 | 1/2003 | Westerman |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | McDonald et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,845 B1 | 4/2003 | Grucci et al. |
| 6,546,297 B1 | 4/2003 | Gaston et al. |
| 6,554,469 B1 | 4/2003 | Thomson et al. |
| 6,556,044 B2 | 4/2003 | Langhammer et al. |
| 6,557,164 B1 | 4/2003 | Faustini |
| 6,559,685 B2 | 5/2003 | Green |
| 6,560,306 B1 | 5/2003 | Duffy et al. |
| 6,560,699 B1 | 5/2003 | Konkle |
| 6,563,391 B1 | 5/2003 | Mar |
| 6,564,179 B1 | 5/2003 | Belhaj |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,590,589 B1 | 7/2003 | Sluiman et al. |
| 6,591,369 B1 | 7/2003 | Edwards et al. |
| 6,592,626 B1 | 7/2003 | Bauchot et al. |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,611,220 B1 | 8/2003 | Snyder |
| 6,611,856 B1 | 8/2003 | Liao et al. |
| 6,611,952 B1 | 8/2003 | Prakash et al. |
| 6,610,936 B2 | 9/2003 | Gillespie et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,634,009 B1 | 10/2003 | Molson et al. |
| 6,636,096 B2 | 10/2003 | Schaffer et al. |
| 6,636,169 B1 | 10/2003 | Distinti et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B2 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |
| 6,661,410 B2 | 12/2003 | Casebolt et al. |
| 6,661,724 B1 | 12/2003 | Snyder et al. |
| 6,664,991 B1 | 12/2003 | Chew et al. |
| 6,667,740 B2 | 12/2003 | Ely et al. |
| 6,670,852 B1 | 12/2003 | Hauck |
| 6,671,869 B2 | 12/2003 | Davidson et al. |
| 6,673,308 B2 | 1/2004 | Hino et al. |
| 6,677,814 B2 | 1/2004 | Low et al. |
| 6,678,645 B1 | 1/2004 | Rajsuman et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,697,754 B1 | 2/2004 | Alexander |
| 6,701,340 B1 | 3/2004 | Gorecki |
| 6,701,487 B1 | 3/2004 | Ogami et al. |

| | | |
|---|---|---|
| 6,701,508 B1 | 3/2004 | Bartz et al. |
| 6,703,961 B2 | 3/2004 | Mueck et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,724,220 B1 | 4/2004 | Snyder et al. |
| 6,725,441 B1 | 4/2004 | Keller et al. |
| 6,728,900 B1 | 4/2004 | Meli |
| 6,728,902 B2 | 4/2004 | Kaiser et al. |
| 6,730,863 B1 | 5/2004 | Gerpheide et al. |
| 6,731,552 B2 | 5/2004 | Perner |
| 6,732,068 B2 | 5/2004 | Sample et al. |
| 6,732,347 B1 | 5/2004 | Bixler et al. |
| 6,738,858 B1 | 5/2004 | Fernald et al. |
| 6,744,323 B1 | 6/2004 | Moyal et al. |
| 6,745,369 B1 | 6/2004 | May et al. |
| 6,748,569 B1 | 6/2004 | Brooke et al. |
| 6,750,852 B2 | 6/2004 | Gillespie |
| 6,750,876 B1 | 6/2004 | Atsatt et al. |
| 6,750,889 B1 | 6/2004 | Livingston et al. |
| 6,754,723 B2 | 6/2004 | Kato |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B2 | 9/2004 | Nishi |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 * | 10/2004 | Xin-LeBlanc ................. 327/156 |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, II et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Latham, II et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,014 B2 | 5/2005 | Son et al. |
| 6,903,402 B2 | 6/2005 | Miyazawa |
| 6,903,613 B1 | 6/2005 | Mitchell et al. |
| 6,904,570 B2 | 6/2005 | Foote et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Müller et al. |
| 6,934,674 B1 | 8/2005 | Douezy et al. |
| 6,937,075 B2 | 8/2005 | Lim et al. |
| 6,940,356 B2 | 9/2005 | McDonald et al. |
| 6,941,336 B1 | 9/2005 | Mar |
| 6,941,538 B2 | 9/2005 | Hwang et al. |
| 6,944,018 B2 | 9/2005 | Caldwell |
| 6,949,811 B2 | 9/2005 | Miyazawa |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,961,686 B2 | 11/2005 | Kodosky et al. |
| 6,963,233 B2 | 11/2005 | Puccio et al. |
| 6,963,908 B1 | 11/2005 | Lynch et al. |
| 6,966,039 B1 | 11/2005 | Bartz et al. |
| 6,967,511 B1 | 11/2005 | Sullam |
| 6,967,960 B1 | 11/2005 | Bross et al. |
| 6,968,346 B2 | 11/2005 | Hekmatpour |
| 6,969,978 B2 | 11/2005 | Dening |
| 6,970,844 B1 | 11/2005 | Bierenbaum |
| 6,971,004 B1 | 11/2005 | Pleis et al. |
| 6,973,400 B2 | 12/2005 | Cahill-O'Brien et al. |
| 6,975,123 B1 | 12/2005 | Malang et al. |
| 6,980,060 B2 | 12/2005 | Boerstler et al. |
| 6,981,090 B1 | 12/2005 | Kutz et al. |
| 6,988,192 B2 | 1/2006 | Snider |
| 7,005,933 B1 | 2/2006 | Shutt |
| 7,009,444 B1 | 3/2006 | Scott |
| 7,010,773 B1 | 3/2006 | Bartz et al. |
| 7,015,735 B2 | 3/2006 | Kimura et al. |
| 7,017,409 B2 | 3/2006 | Zielinski et al. |
| 7,020,854 B2 | 3/2006 | Killian et al. |
| 7,023,215 B2 | 4/2006 | Steenwyk |
| 7,023,257 B1 | 4/2006 | Sullam |
| 7,024,636 B2 | 4/2006 | Weed |
| 7,024,654 B2 | 4/2006 | Bersch et al. |
| 7,026,861 B2 | 4/2006 | Steenwyk |
| 7,030,513 B2 | 4/2006 | Caldwell |
| 7,030,656 B2 | 4/2006 | Lo et al. |
| 7,030,688 B2 | 4/2006 | Dosho et al. |
| 7,030,782 B2 | 4/2006 | Ely et al. |
| 7,034,603 B2 | 4/2006 | Brady et al. |
| 7,042,301 B2 | 5/2006 | Sutardja |
| 7,047,166 B2 | 5/2006 | Dancea |
| 7,073,158 B2 | 7/2006 | McCubbrey |
| 7,076,420 B1 | 7/2006 | Snyder et al. |
| 7,079,166 B1 | 7/2006 | Hong |
| 7,088,166 B1 | 8/2006 | Reinschmidt et al. |
| 7,089,175 B1 | 8/2006 | Nemecek et al. |

| | | |
|---|---|---|
| 7,091,713 B2 | 8/2006 | Erdelyi et al. |
| 7,092,980 B1 | 8/2006 | Mar et al. |
| 7,098,414 B2 | 8/2006 | Caldwell |
| 7,099,818 B1 | 8/2006 | Nemecek |
| 7,100,133 B1 | 8/2006 | Meiyappan et al. |
| 7,109,978 B2 | 9/2006 | Gillespie et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,133,140 B2 | 11/2006 | Lukacs et al. |
| 7,133,793 B2 | 11/2006 | Ely et al. |
| 7,138,868 B2 | 11/2006 | Sanchez et al. |
| 7,139,530 B2 | 11/2006 | Kusbel |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,151,528 B2 | 12/2006 | Taylor et al. |
| 7,152,027 B2 | 12/2006 | Andrade et al. |
| 7,154,294 B2 * | 12/2006 | Liu et al. ......................... 326/27 |
| 7,324,380 B2 | 12/2006 | Negut et al. |
| 7,161,936 B1 | 1/2007 | Barrass et al. |
| 7,162,410 B1 | 1/2007 | Nemecek et al. |
| 7,171,455 B1 | 1/2007 | Gupta et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,199,783 B2 | 4/2007 | Wenstrand et al. |
| 7,200,507 B2 | 4/2007 | Chen et al. |
| 7,206,733 B1 | 4/2007 | Nemecek |
| 7,212,189 B2 | 5/2007 | Shaw et al |
| 7,221,187 B1 | 5/2007 | Snyder et al. |
| 7,227,389 B2 | 6/2007 | Gong et al. |
| 7,236,921 B1 | 6/2007 | Nemecek et al. |
| 7,250,825 B2 | 7/2007 | Wilson et al. |
| 7,256,588 B2 | 8/2007 | Howard et al. |
| 7,266,768 B2 | 9/2007 | Ferlitsch et al. |
| 7,281,846 B2 | 10/2007 | McLeod |
| 7,282,905 B2 | 10/2007 | Chen et al. |
| 7,283,410 B2 | 10/2007 | Hsu et al. |
| 7,287,112 B1 | 10/2007 | Pleis et al. |
| 7,288,977 B2 | 10/2007 | Stanley |
| 7,290,244 B2 | 10/2007 | Peck et al. |
| 7,295,049 B1 | 11/2007 | Moyal et al. |
| 7,298,124 B2 | 11/2007 | Kan et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,392,011 B1 | 6/2008 | Jacomb-Hood |
| 7,400,183 B1 | 7/2008 | Sivadasan et al. |
| 7,421,251 B2 | 9/2008 | Westwick et al. |
| 7,461,274 B2 | 12/2008 | Merkin |
| 7,466,307 B2 | 12/2008 | Trent, Jr. et al. |
| 7,542,533 B2 | 6/2009 | Jasa et al. |
| 7,554,847 B2 | 6/2009 | Lee |
| 7,809,545 B2 | 10/2010 | Ciofi et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0010716 A1 | 1/2002 | McCartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll, Jr. |
| 2002/0099863 A1 | 7/2002 | Comeau et al. |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0144099 A1 | 10/2002 | Muro, Jr. et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174411 A1 | 11/2002 | Feng et al. |
| 2002/0191029 A1 | 12/2002 | Gillespie et al. |
| 2003/0011639 A1 | 1/2003 | Webb |
| 2003/0014447 A1 | 1/2003 | White |
| 2003/0025734 A1 | 2/2003 | Boose et al. |
| 2003/0033588 A1 | 2/2003 | Alexander |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061572 A1 | 3/2003 | McClannahan et al. |
| 2003/0062889 A1 | 4/2003 | Ely et al. |
| 2003/0066057 A1 | 4/2003 | RuDusky |
| 2003/0080755 A1 | 5/2003 | Kobayashi |
| 2003/0086300 A1 | 5/2003 | Noyes et al. |
| 2003/0097640 A1 | 5/2003 | Abrams et al. |
| 2003/0105620 A1 | 6/2003 | Bowen |
| 2003/0126947 A1 | 7/2003 | Moore et al. |
| 2003/0149961 A1 | 8/2003 | Kawai et al. |
| 2003/0229482 A1 | 12/2003 | Cook et al. |
| 2004/0018711 A1 | 1/2004 | Madurawe |
| 2004/0054821 A1 | 3/2004 | Warren et al. |
| 2004/0153802 A1 | 8/2004 | Kudo et al. |
| 2004/0205553 A1 | 10/2004 | Hall et al. |
| 2004/0205617 A1 | 10/2004 | Light |
| 2005/0024341 A1 | 2/2005 | Gillespie et al. |
| 2005/0143968 A9 | 6/2005 | Odom et al. |
| 2005/0248534 A1 | 11/2005 | Kehlstadt |
| 2005/0280453 A1 | 12/2005 | Hsieh |
| 2006/0015862 A1 | 1/2006 | Odom et al. |
| 2006/0031768 A1 | 2/2006 | Shah et al. |
| 2006/0032680 A1 | 2/2006 | Elias et al. |
| 2006/0097991 A1 | 5/2006 | Hotelling et al. |
| 2006/0273804 A1 | 12/2006 | Delorme et al. |
| 2007/0139074 A1 | 6/2007 | Reblewski |
| 2008/0086668 A1 | 4/2008 | Jefferson et al. |
| 2008/0095213 A1 | 4/2008 | Lin et al. |
| 2008/0186052 A1 | 8/2008 | Needham et al. |
| 2008/0259998 A1 | 10/2008 | Venkataraman et al. |
| 2008/0294806 A1 | 11/2008 | Swindle et al. |

FOREIGN PATENT DOCUMENTS

| | | |
|---|---|---|
| EP | 0308583 A1 | 3/1989 |
| EP | 0308583 A2 | 3/1989 |
| EP | 368398 A1 | 5/1990 |
| EP | 0450863 A1 | 10/1991 |
| EP | 0450863 A2 | 10/1991 |
| EP | 0499383 A1 | 8/1992 |
| EP | 0499383 A2 | 8/1992 |

| | | |
|---|---|---|
| EP | 0639816 A1 | 2/1995 |
| EP | 0639816 A2 | 2/1995 |
| EP | 1170671 A1 | 1/2002 |
| EP | 1205848 A1 | 5/2002 |
| EP | 1191423 A1 | 2/2003 |
| EP | 1191423 A2 | 2/2003 |
| JP | 404083405 A1 | 3/1992 |
| JP | 405055542 A1 | 3/1993 |
| JP | 06021732 A1 | 1/1994 |
| JP | 404095408 A1 | 3/2002 |
| WO | 9532478 A1 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

U.S. Appl. No. 11/322,044, Stiff, Jonathon.
USPTO Notice of Allowance for U.S. Appl. No. 10/238,966 dated Jan. 27, 2009; 4 pages.
USPTO Non-Final Rejection for U.S. Appl. No. 10/238,966 dated Jun. 30, 2008; 12 pages.
USPTO Non-Final Rejection for U.S. Appl. No. 10/238,966 dated Dec. 26, 2007; 12 pages.
USPTO Final Rejection for U.S. Appl. No. 10/238,966 dated Sep. 27, 2007; 9 pages.
USPTO Non-Final Rejection for U.S. Appl. No. 10/238,966 dated Apr. 19, 2007; 7 pages.
USPTO Non-Final Rejection for U.S. Appl. No. 10/238,966 dated Oct. 20, 2006; 8 pages.
USPTO Non-Final Rejection for U.S. Appl. No. 10/238,966 dated Apr. 6, 2006; 8 pages.
USPTO Notice of Allowance for U.S. Appl. No. 10/033,027 dated Mar. 31, 2009; 7 pages.
USPTO Non-Final Rejection for U.S. Appl. No. 10/033,027 dated Dec. 18, 2008; 5 pages.
USPTO Final Rejection for U.S. Appl. No. 10/033,027 dated Jun. 8, 2007; 8 pages.
USPTO Non-Final Rejection for U.S. Appl. No. 10/033,027 dated Dec. 21, 2006; 31 pages.
USPTO Final Rejection for U.S. Appl. No. 10/033,027 dated Aug. 9, 2006; 6 pages.
USPTO Non-Final Rejection for U.S. Appl. No. 10/033,027 dated Apr. 26, 2006; 26 pages.
USPTO Final Rejection for U.S. Appl. No. 10/033,027 dated Oct. 31, 2005; 24 pages.
USPTO Non-Final Rejection for U.S. Appl. No. 10/033,027 dated Apr. 20, 2005; 20 pages.
USPTO Non-Final Rejection for U.S. Appl. No. 10/033,027 dated Oct. 18, 2004; 17 pages.
USPTO Non-Final Rejection for U.S. Appl. No. 10/001,478 dated Oct. 20, 2008; 18 pages.
USPTO Final Rejection for U.S. Appl. No. 10/001,478 dated Jun. 4, 2008; 18 pages.
USPTO Non-Final Rejection for U.S. Appl. No. 10/001,478 dated Jan. 30, 2008; 19 pages.
USPTO Final Rejection for U.S. Appl. No. 10/001,478 dated Sep. 17, 2007; 15 pages.
USPTO Non-Final Rejection for U.S. Appl. No. 10/001,478 dated Apr. 2, 2007; 17 pages.
USPTO Final Rejection for U.S. Appl. No. 10/001,478 dated Sep. 5, 2006; 19 pages.
USPTO Non-Final Rejection for U.S. Appl. No. 10/001,478 dated Mar. 15, 2006; 19 pages.
USPTO Final Rejection for U.S. Appl. No. 10/001,478 dated Oct. 24, 2005; 15 pages.
USPTO Non-Final Rejection for U.S. Appl. No. 10/001,478 dated May 16, 2005; 13 pages.
USPTO Notice of Allowance for U.S. Appl. No. 10/002,217 dated Jan. 28, 2009; 4 pages.
USPTO Notice of Allowance for U.S. Appl. No. 10/002,217 dated Oct. 14, 2008; 6 pages.
USPTO Notice of Allowance for U.S. Appl. No. 10/002,217 dated Jun. 6, 2008; 7 pages.
USPTO Final Rejection for U.S. Appl. No. 10/002,217 dated Feb. 6, 2008; 10 pages.
USPTO Non-Final Rejection for U.S. Appl. No. 10/002,217 dated Aug. 3, 2007; 10 pages.
USPTO Final Rejection for U.S. Appl. No. 10/002,217 dated Mar. 7, 2007; 12 pages.
USPTO Non-Final Rejection for U.S. Appl. No. 10/002,217 dated Oct. 2, 2006; 21 pages.
USPTO Non-Final Rejection for U.S. Appl. No. 10/002,217 dated Apr. 3, 2006; 12 pages.
USPTO Final Rejection for U.S. Appl. No. 10/002,217 dated Nov. 17, 2005; 17 pages.
USPTO Non-Final Rejection for U.S. Appl. No. 10/002,217 dated May 19, 2005; 15 pages.
USPTO Notice of Allowance for U.S. Appl. No. 10/001,477 dated Nov. 10, 2008; 7 pages.
USPTO Advisory Action for U.S. Appl. No. 10/001,477 dated Oct. 10, 2008; 3 pages.
USPTO Final Rejection for U.S. Appl. No. 10/001,477 dated Jun. 30, 2008; 15 pages.
USPTO Non-Final Rejection for U.S. Appl. No. 10/001,477 dated Dec. 6, 2007; 13 pages.
USPTO Final Rejection for U.S. Appl. No. 10/001,477 dated Jul. 23, 2007; 16 pages.
USPTO Non-Final Rejection for U.S. Appl. No. 10/001,477 dated Jan. 22, 2007; 15 pages.
USPTO Final Rejection for U.S. Appl. No. 10/001,477 dated Aug. 24, 2006, 13 pages.
USPTO Non-Final Rejection for U.S. Appl. No. 10/001,477 dated Mar. 2, 2006; 14 pages.
USPTO Final Rejection for U.S. Appl. No. 10/001,477 dated Oct. 24, 2005; 13 pages.
USPTO Non-Final Rejection for U.S. Appl. No. 10/001,477 dated May 11, 2005; 10 pages.
"Micropower CMOS Temperature Sensor with Digital Output;" Bakker et al., IEEE Journal of Solid-State Circuits, 1996; 3 pages.
"WP 3.5: An Integrated Time Reference;" Blauschild, Digest of Technical Papers, 1994; 4 pages.
"An Analog PPL-Based Clock and Data Recovery Circuit with High Input Jitter Tolerance;" Sun, Reprinted from IEEE Journal of Solid-State Circuits, 1989; 4 pages.
U.S. Appl. No. 09/842,966: "Precision Crystal Oscillator Circuit Used in Microcontroller," Mar; 28 pages.
U.S. Appl. No. 09/964,991: "A Novel Band-Gap Circuit for Providing an Accurate Reference Voltage Compensated for Process State, Process Variations and Temperature," Kutz et al.; 25 pages.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.
USPTO Non-Final Rejection for U.S. Appl. No. 09/975,115 dated Jan. 7, 2008; 30 pages.
USPTO Non-Final Rejection for U.S. Appl. No. 09/975,115 dated Jul. 31, 2007; 28 pages.
USPTO Final Rejection for U.S. Appl. No. 09/975,115 dated Feb. 21, 2007; 25 pages.
USPTO Non-Final Rejection for U.S. Appl. No. 09/975,115 dated Oct. 31, 2006; 19 pages.
USPTO Final Rejection for U.S. Appl. No. 09/975,115 dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.

USPTO Non-Final Rejection for U.S. Appl. No. 09/975,338 dated Sep. 6, 2006; 11 pages.
USPTO Advisory Action for U.S. Appl. No. 09/975,338 dated May 15, 2006; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 25, 2005; 17 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Notice of Allowance for U.S. Appl. No. 10/008,096 dated Dec. 22, 2008; 24 pages.
USPTO Notice of Allowance for U.S. Appl. No. 09/975,105 dated Dec. 4, 2006; 4 pages.
USPTO Final Rejection for U.S. Appl. No. 09/975,105 dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block;" Mar; 46 pages.
U.S. Appl. No. 10/238,966: "Method for Parameterizing a User Module;" Perrin; 41 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final Rejection for U.S. Appl. No. 10/324,455 dated Aug. 21, 2003; 4 pages.
USPTO Notice of Allowance for U.S. Appl. No. 09/998,859 dated Mar. 14, 2005; 6 pages.
USPTO Non-Final Rejection for U.S. Appl. No. 09/998,859 dated Nov. 4, 2004; 6 pages.
USPTO Final Rejection for U.S. Appl. No. 09/998,859 dated Nov. 19, 2003; 5 pages.
USPTO Non-Final Rejection for U.S. Appl. No. 09/998,859 dated May 28, 2003; 6 pages.
USPTO Non-Final Rejection for U.S. Appl. No. 09/998,859 dated May 15, 2003; 6 pages.
USPTO Notice of Allowance for U.S. Appl. No. 09/998,834 dated May 19, 2005; 7 pages.
USPTO Non-Final Rejection for U.S. Appl. No. 09/998,834 dated Sep. 20, 2004; 11 pages.
USPTO Notice of Allowance for U.S. Appl. No. 10/113,065 dated Apr. 6, 2006; 8 pages.
USPTO Final Rejection for U.S. Appl. No. 10/113,065 dated Oct. 26, 2005; 17 pages.
USPTO Non-Final Rejection for U.S. Appl. No. 10/113,065 dated May 20, 2005; 14 pages.
U.S. Appl. No. 09/207,912: "Circuit(s), Architecture and Method(s) for Operating and/or Tuning a Ring Oscillator;" Mar; 23 pages.
USPTO Notice of Allowance for U.S. Appl. No. 10/001,477 dated May 8, 2009; 6 pages.

U.S. Appl. No. 60/752,804: "A Latched Differential-to-Single Ended Signal Converter," Stiff; 9 pages.
From U.S. Appl. No. 10/033,027: Goodenough, F. "Analog Counterparts of FPGAS Ease System Design" Electronic Design, Penton Publishing, Cleveland, OH, US vol. 42, No. 21, Oct. 14, 1994; 10 pages.
From U.S. Appl. No. 10/033,027: Harbaum, T. et al. "Design of a Flexible Coprocessor Unit" Proceedings of the Euromicro Conference, XX XX, Sep. 1999; 10 pages.
From U.S. Appl. No. 10/033,027; "Programmable Microcontroller (PSoC) Architecture (Mixed Analog/Digital)"; Aug. 7, 2001; U.S. Appl. No. 09/924,734 Snyder et al.; 28 pages.
From U.S. Appl. No. 10/033,027; "Digital Configurable Macro Architecture"; Jul. 18, 2001; U.S. Appl. No. 09/909,045; Snyder; 37 pages.
From U.S. Appl. No. 10/033,027: "Configuring Digital Functions in a Digital Configurable Macro Architecture"; Jul. 18, 2001; U.S. Appl. No. 09/909,109; Snyder; 38 pages.
From U.S. Appl. No. 10/033,027: "A Programmable Analog System Architecture (As Amended)", Jul. 18, 2001; U.S. Appl. No. 09/909,047; Mar; 60 pages.
From U.S. Appl. No. 10/033,027: "Programmable Methodology and Architecture for a Programmable Analog System (As Amended)", Aug. 14, 2001; U.S. Appl. No. 09/930,021; Mar et al.; 87 pages.
From U.S. Appl. No. 10/033,027: "Method for Synchronizing and Resetting Clock Signals Supplied to Multiple Programmable Analog Blocks (As Amended)"; Oct. 1, 2001; U.S. Appl. No. 09/969;311; Sullam; 57 pages.
From U.S. Appl. No. 10/033,027: "Method and Apparatus for Programming a Flash Memory"; Jun. 5, 2001; U.S. Appl. No. 09/875,599; Snyder; 23 pages.
From U.S. Appl. No. 10/033,027: "In-System Chip Emulator Architecture"; Oct. 10, 2001; U.S. Appl. No. 09/975,115; Snyder et al.; 38 pages.
From U.S. Appl. No. 10/033,027: "A Configurable Input/Output Interface for a Microcontroller"; Sep. 14, 2001; U.S. Appl. No. 09/953,423; Kutz et al.; 28 pages.
From U.S. Appl. No. 10/033,027: "Multiple Use of Microcontroller Pad"; Jun. 26, 2001; U.S. Appl. No. 09/893,050; Kutz et al.; 21 pages.
From U.S. Appl. No. 10/033,027: "Programming Architecture for a Programmable Analog System"; Aug. 14, 2001; U.S. Appl. No. 09/929,891; Mar et al.; 82 pages.
From U.S. Appl. No. 10/033,027: "Architecture for Synchronizing and Resetting Clock Signals Supplied to Multiple Analog Programmable Analog Blocks"; Oct. 1, 2001; U.S. Appl. No. 09/969,313; Sullam; 50 pages.
USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 14 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 13 pages.
Hintz et al.; "Microcontrollers", 1992, McGraw-Hill; 11 pages.
Ganapathy, Gopi, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996; 4 pages.
The U.S. Appl. No. 60/243,708 "Advanced Programmable Microcontroller Device"; 277 pages.
"Webster's Third New International Dictionary", 1996, G. & C. Merriam Company; 3 pages.
USPTO Advisory Action for U.S. Appl. No. 09/998,848 dated Sep. 7, 2005; 3 pages.
U.S. Appl. No. 09/957,084: "A Crystal-Like Oscillator with Trimmable Analog Current Control for Increased Stability;" Mar; 28 pages.
U.S. Appl. No. 09/969,313: "Architecture for Synchronizing and Resetting Clock Signals Supplied to Multiple Analog Programmable System on a Chip Block;" Sullam; 50 pages.
U.S. Appl. No. 09/972,319: "Method for Applying Instructions to Microprocessor in Test Mode;" Snyder; 31 pages.

U.S. Appl. No. 09/972,003: "Test Architecture for Microcontroller Providing for a Serial Communication Interface;" Snyder; 32 pages.
U.S. Appl. No. 09/972,133: "Method for Entering Circuit Test Mode;" Snyder; 30 pages.
U.S. Appl. No. 09/973,535: "Architecture for Decimation Algorithm;" Snyder; 26 pages.
U.S. Appl. No. 09/977,111: A Frequency Doubler Circuit with Trimmable Current Control; Shutt; 35 pages.
U.S. Appl. No. 10/272,231: "Digital Configurable Macro Architecture;" Snyder; 36 pages.
U.S. Appl. No. 11/125,554: "A Method for a Efficient Supply to a Microcontroller" Kutz; 1 page.
U.S. Appl. No. 09/855,868: "Protecting Access to Microcontroller Memory Blocks;" Snyder; 28 pages.
U.S. Appl. No. 09/887,923: "Novel Method and System for Interacting between a Processor and a Power on Reset to Dynamically Control Power States in a Microcontroller;" Kutz; 44 pages.
U.S. Appl. No. 10/000,383: "System and Method of Providing a Programmable Clock Architecture for an Advanced Microcontroller;" Sullam; 34 pages.
U.S. Appl. No. 10/001,477: "Breakpoint Control in an In-Circuit Emulation System;" Roe; 43 pages.
U.S. Appl. No. 10/004,197: "In-Circuit Emulator with Gatekeeper Based Halt Control;" Nemecek; 47 pages.
U.S. Appl. No. 10/004,039: "In-Circuit Emulator with Gatekeeper for Watchdog Timer;" Nemecek; 46 pages.
U.S. Appl. No. 10/002,217: "Conditional Branching in an In-Circuit Emulation System;" Nemecek; 43 pages.
U.S. Appl. No. 10/001,568: "Combined In-Circuit Emulator and Programmer;" Nemecek; 47 pages.
U.S. Appl. No. 10/001,478: "In-Circuit Emulator and POD Synchronized Boot" Nemecek; 44 pages.
U.S. Appl. No. 09/887,955: "Novel Power on Reset Circuit for Microcontroller;" Kutz; 42 pages.
U.S. Appl. No. 09/826,397: "Method and Circuit for Allowing a Microprocessor to Change its Operating Frequency on-the-fly;" Sullam; 24 pages.
U.S. Appl. No. 09/893,048: "A Microcontroller having an On-Chip High Gain Amplifier;" Kutz; 22 pages.
U.S. Appl. No. 09/912,768: "A Microcontroller having a Dual Mode Relax Oscillator that is Trimmable," Shutt; 33 pages.
U.S. Appl. No. 09/922,419: "A Power Supply Pump Circuit for a Microcontroller;" Kutz; 38 pages.
U.S. Appl. No. 09/922,579: "A Method for a Efficient Supply to a Microcontroller;" Kutz; 37 pages.
U.S. Appl. No. 09/923,461: "Non-Interfering Multiply-Mac (Multiply Accumulate) Circuit;" Snyder; 25 pages.
U.S. Appl. No. 09/935,454: "Method and Apparatus for Local and Global Power Management in a Programmable Analog Circuit;" Mar; 51 pages.
U.S. Appl. No. 10/011,214: "Method and Circuit for Synchronizing a Write Operation between an On-Chip Microprocessor and an On-Chip Programmable Analog Device Operating at Different Frequencies;" Sullam; 49 pages.
Bursky, "FPGA Combines Multiple Interfaces and Logic," Electronic Design, vol. 48 No. 20, pp. 74-78 (Oct. 2, 2000); 5 pages.
Anonymous, "Warp Nine Engineering—The IEEE 1284 Experts-F/Port Product Sheet," undated web page found at http://www.fapo.com/fport.htm; 2 pages.
Anonymous, "F/Port:Fast Parallel Port for the PC" Installation Manual Release 7.1, circa 1997, available for download from http://www.fapo.com/fport.htm; 25 pages.
Nam et al.; "Fast Development of Source-Level Debugging System Using Hardware Emulation"; IEEE 2000; 4 pages.
Huang et al.; "Iceberg: An Embedded In-Circuit Emulator Synthesizer For Microcontrollers"; ACM 1999; 6 pages.
Khan et al.; "FPGA Architectures for Asic Hardware Emulators"; IEEE 1993; 5 pages.
Oh et al.; Emulator Environment Based on an FPGA Prototyping Board; IEEE; Jun. 21-23, 2000; 6 pages.
Hong et al.; "An FPGA-Based Hardware Emulator for Fast Fault Emulation"; IEEE 1997; 4 pages.

Ching et al.; "An In-Curcuit-Emulator for TMS320C25"; IEEE 1994; 6 pages.
Pasternak; "In-Circuit-Emulation in ASIC Architecture Cor Designs"; IEEE 1989; 4 pages.
Melear; "Using Background Modes for Testing, Debugging and Emulation of Microcontrollers"; IEEE 1997; 8 pages.
Walters, Stephen; "Computer-Aided Prototyping for ASIC-Based Systems", 1991, IEEE Design & Test of Computers; vol. 8, Issue 2; 8 pages.
Anonymous; "JEEN JTAG Embedded Ice Ethernet Interface"; Aug. 1999; Embedded Performance, Inc.; 3 pages.
Sedory; "A Guide to Debug"; 2004; retrieved on May 20, 2005; 7 pages.
"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.
Xerox; "Mesa Debugger Documentation"; Apr. 1979; Xerox Systems Development Department; Version 5.0; 33 pages.
Stallman et al.; "Debugging with the GNU Source-Level Debugger"; Jan. 1994; retrieved on May 2, 2005 from http://www.cs.utah.edu; 4 pages.
Wikipedia.org; "Von Neumann architecture"; retrieved from http://en.wikipedia.org/wiki/Von_Neumann_architecture on Jan. 22, 2007; 4 pages.
Stan Augarten; "The Chip Collection—Introduction—Smithsonian Institute"; "State of the Art"; "The First 256-Bit Static RAM"; retrieved on Nov. 14, 2005 from http://smithsonianchips.si.edu/augarten/p24.htm; 2 pages.
"POD—Piece of Data, Plain Old Documentation, Plain Old Dos . . . "; retrieved on Nov. 14, 2005 from http://www.auditmypc.com/acronym/POD.asp; 2 pages.
USPTO Non-Final Rejection for U.S. Appl. No. 09/989,767 dated Oct. 6, 2004; 15 pages.
USPTO Final Rejection for U.S. Appl. No. 09/989,771 dated Feb. 27, 2007; 8 pages.
USPTO Final Rejection for U.S. Appl. No. 09/989,771 dated Mar. 28, 2006; 9 pages.
USPTO Final Rejection for U.S. Appl. No. 09/989,771 dated Apr. 6, 2005; 7 pages.
USPTO Final Rejection for U.S. Appl. No. 09/989,771 dated Dec. 10, 2008; 12 pages.
USPTO Final Rejection for U.S. Appl. No. 09/989,771 dated Dec. 27, 2007; 15 pages.
USPTO Non-Final Rejection for U.S. Appl. No. 09/989,771 dated May 28, 2008; 14 pages.
USPTO Non-Final Rejection for U.S. Appl. No. 09/989,771 dated Jul. 16, 2007; 14 pages.
USPTO Non-Final Rejection for U.S. Appl. No. 09/989,771 dated Aug. 23, 2006; 7 pages.
USPTO Non-Final Rejection for U.S. Appl. No. 09/989,771 dated Sep. 12, 2005; 7 pages.
USPTO Non-Final Rejection for U.S. Appl. No. 09/989,771 dated Sep. 22, 2004; 7 pages.
USPTO Final Rejection for U.S. Appl. No. 09/989,765 dated Apr. 3, 2007; 12 pages.
USPTO Final Rejection for U.S. Appl. No. 09/989,765 dated Apr. 4, 2008; 16 pages.
USPTO Final Rejection for U.S. Appl. No. 09/989,765 dated Apr. 17, 2006; 12 pages.
USPTO Non-Final Rejection for U.S. Appl. No. 09/989,765 dated Sep. 19, 2007; 14 pages.
USPTO Non-Final Rejection for U.S. Appl. No. 09/989,765 dated Sep. 26, 2008; 17 pages.
USPTO Non-Final Rejection for U.S. Appl. No. 09/989,765 dated Oct. 2, 2006; 13 pages.
USPTO Non-Final Rejection for U.S. Appl. No. 09/989,765 dated Oct. 5, 2005; 9 pages.
USPTO Final Rejection for U.S. Appl. No. 09/989,782 dated Jul. 9, 2008; 10 pages.
USPTO Final Rejection for U.S. Appl. No. 09/989,782 dated Jul. 24, 2007; 9 pages.

USPTO Final Rejection for U.S. Appl. No. 09/989,782 dated Sep. 21, 2006; 10 pages.
USPTO Final Rejection for U.S. Appl. No. 09/989,782 dated Nov. 3, 2005; 11 pages.
USPTO Non-Final Rejection for U.S. Appl. No. 09/989,782 dated Jan. 29, 2007; 9 pages.
USPTO Non-Final Rejection for U.S. Appl. No. 09/989,782 dated Mar. 28, 2006; 8 pages.
USPTO Non-Final Rejection for U.S. Appl. No. 09/989,782 dated Apr. 29, 2005; 11 pages.
USPTO Non-Final Rejection for U.S. Appl. No. 09/989,782 dated Oct. 6, 2004; 11 pages.
USPTO Non-Final Rejection for U.S. Appl. No. 09/989,782 dated Nov. 26, 2008; 10 pages.
USPTO Non-Final Rejection for U.S. Appl. No. 09/989,782 dated Dec. 14, 2007; 8 pages.
USPTO Final Rejection for U.S. Appl. No. 09/989,765 dated Mar. 31, 2009; 18 pages.
USPTO Final Rejection for U.S. Appl. No. 09/989,778 dated Mar. 16, 2009; 26 pages.
"Pod-Wikipedia, the free encyclopedia"; retrieved on Nov. 14, 2005 from http://en.wikipedia.org/wiki/Pod; 3 pages.
"Pod-defintion by dict.die.net"; retrieved on Nov. 14, 2005 from http://dict.die.net/pod; 2 pages.
"In-Curcuit Emulators—descriptions of the major ICEs around"; retrieved on Nov. 14, 2005 from http://www.algonet.se/~staffann/developer/emulator.htm; 6 pages.
"Capturing Test/Emulation and Enabling Real-Time Debugging Using FPGA for In-Circuit Emulation;" Oct. 10, 2001; U.S. Appl. No. 09/975,104; Snyder; 35 pages.
USPTO Non-Final Rejection for U.S. Appl. No. 09/989,767 dated Jul. 24, 2008; 21 pages.
Anonymous; "Using Debug"; 1999; Prentice-Hall Publishing; 20 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.
Microsoft Press Computer User's Dictionary; 1998; 3 pages.
Sreeram Duvvuru and Siamak Arya, "Evaluation of a Branch Target Address Cache," 1995; IEEE; 8 pages.
Andrew S. Tanenbaum with contributions from James R. Goodman, "Structured Computer Organization," 1999, Prentice Hall, Fourth Edition; 32 pages.
"Method for Breaking Execution of a Test Code in DUT and Emulator Chip Essentially Simultaneously and Handling Complex Breakpoint Events;" Oct. 10, 2001; U.S. Appl. No. 09/975,338; Nemecek et al.; 34 pages.
"Emulator Chip-Board Architecture for Interface;" Oct. 10, 2001; U.S. Appl. No. 09/975,030; Snyder et al.; 37 pages.
Wikipedia—Main Page, retrieved on Mar. 8, 2006 from http://en.wikipedia.org/wiki/Main_Page and http://en.wikipedia.org/wiki/Wikipedia:Introduction; 5 pages.
Wikipedia—Processor register, retrieved on Mar. 7, 2006 from http://en.wikipedia.org/wiki/Processor_register; 4 pages.
Jonathan B. Rosenburg, "How Debuggers Work" John Wiley & Sons, Inc. 1996; 259 pages.
Dahl, et al.; "Emulation of the Sparcle Microprocessor with the MIT Virtual Wires Emulation System"; 1994; IEEE; 9 pages.
Bauer et al.; "A Reconfigurable Logic Machine for Fast Event-Driven Simulation"; 1998; Design Automation Conference Proceedings; 8 pages.
"Host to FPGA Interface in an In-Circuit Emulation System;" Oct. 10, 2001; U.S. Appl. No. 09/975,105; Nemecek; 44 pages.
USPTO Advisory Action for U.S. Appl. No. 09/994,601 dated May 23, 2006; 3 pages.
USPTO Non-Final Rejection for U.S. Appl. No. 09/994,601 dated Jul. 29, 2004; 10 pages.
USPTO Ex Parte Qualyle Action for U.S. Appl. No. 09/992,076 dated Jun. 18, 2007; 6 pages.
USPTO Non-Final Rejection for U.S. Appl. No. 09/992,076 dated Aug. 10, 2006; 19 pages.
USPTO Notice of Allowance for U.S. Appl. No. 09/992,076 dated Mar. 26, 2008; 23 pages.
USPTO Notice of Allowance for U.S. Appl. No. 09/992,076 dated Jul. 29, 2008; 6 pages.
USPTO Advisory Action for U.S. Appl. No. 09/989,778 dated May 15, 2006; 4 pages.
USPTO Final Rejection for U.S. Appl. No. 09/989,778 dated Jan. 8, 2009; 25 pages.
USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Final Rejection for U.S. Appl. No. 09/989,767 dated Jan. 11, 2007; 12 pages.
USPTO Final Rejection for U.S. Appl. No. 09/989,767 dated Jan. 15, 2009; 21 pages.
USPTO Final Rejection for U.S. Appl. No. 09/989,767 dated Mar. 6, 2006; 15 pages.
USPTO Final Rejection for U.S. Appl. No. 09/989,767 dated Apr. 6, 2005; 13 pages.
USPTO Final Rejection for U.S. Appl. No. 09/989,767 dated Dec. 27, 2007; 21 pages.
USPTO Non-Final Rejection for U.S. Appl. No. 09/989,767 dated Jul. 17, 2006; 12 pages.
USPTO Non-Final Rejection for U.S. Appl. No. 09/989,767 dated Jul. 2, 2007; 22 pages.
USPTO Notice of Allowance for U.S. Appl. No. 09/992,076 dated Nov. 13, 2008; 15 pages.
USPTO Final Rejection for U.S. Appl. No. 09/994,601 dated May 18, 2007; 17 pages.
USPTO Notice of Allowance for U.S. Appl. No. 09/992,076 dated Nov. 29, 2007; 8 pages.
USPTO Final Rejection for U.S. Appl. No. 09/992,076 dated Jan. 30, 2007; 32 pages.
USPTO Non-Final Rejection for U.S. Appl. No. 09/992,076 dated Aug. 10, 2006; 19 pages.
USPTO Final Rejection for U.S. Appl. No. 09/992,076 dated Mar. 17, 2006; 16 pages.
USPTO Non-Final Rejection for U.S. Appl. No. 09/992,076 dated Nov. 21, 2005; 29 pages.
USPTO Non-Final Rejection for U.S. Appl. No. 09/992,076 dated Jun. 1, 2005; 20 pages.
USPTO Notice of Allowance for U.S. Appl. No. 09/994,600 dated Nov. 12, 2008; 35 pages.
USPTO Notice of Allowance for U.S. Appl. No. 09/994,600 dated May 14, 2008; 22 pages.

USPTO Final Rejection for U.S. Appl. No. 09/994,600 dated Oct. 17, 2007; 13 pages.
USPTO Non-Final Rejection for U.S. Appl. No. 09/994,600 dated May 15, 2007; 14 pages.
USPTO Final Rejection for U.S. Appl. No. 09/994,600 dated Dec. 8, 2006; 14 pages.
USPTO Non-Final Rejection for U.S. Appl. No. 09/994,600 dated Jul. 17, 2006; 14 pages.
USPTO Final Rejection for U.S. Appl. No. 09/994,600 dated Feb. 13, 2006; 13 pages.
USPTO Non-Final Rejection for U.S. Appl. No. 09/994,600 dated Aug. 23, 2005; 13 pages.
USPTO Final Rejection for U.S. Appl. No. 09/994,600 dated May 4, 2005; 16 pages.
USPTO Non-Final Rejection for U.S. Appl. No. 09/994,600 dated Oct. 21, 2004; 37 pages.
USPTO Notice of Allowance for U.S. Appl. No. 10/001,477 dated Nov. 10, 2008; 13 pages.
USPTO Final Rejection for U.S. Appl. No. 10/001,477 dated Jun. 30, 2008; 19 pages.
USPTO Non-Final Rejection for U.S. Appl. No. 10/001,477 dated Dec. 6, 2007; 17 pages.
USPTO Final Rejection for U.S. Appl. No. 10/001,477 dated Jul. 23, 2007; 19 pages.
USPTO Non-Final Rejection for U.S. Appl. No. 10/001,477 dated Jan. 22, 2007; 17 pages.
USPTO Final Rejection for U.S. Appl. No. 10/001,477 dated Aug. 24, 2006; 15 pages.
USPTO Non-Final Rejection for 10/001,477 dated Mar. 02, 2006; 17 pages.
USPTO Final Rejection for U.S. Appl. No. 10/001,477 dated Oct. 24, 2005; 18 pages.
USPTO Non-Final Rejection for U.S. Appl. No. 10/001,477 dated May 11, 2005; 31 pages.
Ito, Sergio Akira and Carro, Luigi; "A Comparison of Microcontrollers Targeted to FPGA-Based Embedded Applications", Sep. 2000, Proceedings of the 13th Symposium on Integrated Circuits and Systems Design, Sep. 18-24, 2000; 6 pages.
Julio Faure et al.; "A Novel Mixed Signal Programmable Device With On-Chip Microprocessor", 1997, IEEE 1997 Custom Integrated Circuits Conference; 4 pages.
Monte Mar, Bert Sullam, Eric Blom; "An architecture for a configurable Mixed-signal device", 2003, IEEE Journal of Solid-State Circuits, vol. 3; 4 pages.
Robinson, Gordon D; "Why 1149.1 (JTAG) Really Works", May 1994, Conference Proceedings Electro/94 International, May 10-12, 1994, Combined Volumes; 6 pages.
USPTO Non-Final Rejection for U.S. Appl. No. 09/994,601 dated Oct. 4, 2007; 20 pages.
"PSoC designer: Integrated development environment, getting started 25-minute tutorial, version 1.0", Cypress Microsystems., Cypress Microsystems, Inc. CMS10006A, Jul. 3, 2001; 25 pages.
"PSoC technology complete changes 8-bit MCU system design", Cypress Microsystems, Inc. retrieved from <http://www.archive.arg/web/20010219005250/http://cypressmicro.com-/t...>, Feb. 19, 2001; 21 pages.
Specks et al., "A Mixed Digital-Analog 16B Microcontroller with 0.5MB Flash Memory, On-Chip Power Supply, Physical Newark Interface, and 40V I/0 for Automotive Single-Chip Mechatronics," IEEE, Feb, 9, 2000; 1 page.
Hsieh et at, "Modeling Micro-Controller Peripherals for High-Level Co-Simulation and Synthesis," IEEE, 1997; 4 pages.
USPTO Notice of Allowance for U.S. Appl. No. 09/989,777 dated Nov. 4, 2008; 3 pages.
USPTO Notice of Allowance for U.S. Appl. No. 09/989,777 dated Sep. 15, 2008; 28 pages.
USPTO Notice of Allowance for U.S. Appl. No. 09/989,777 dated Jul. 7, 2008; 23 pages.
USPTO Final Rejection for 09/989,777 dated Jan. 30, 2008; 14 pages.
USPTO Non-Final Rejection for U.S. Appl. No. 09/989,777 dated Sep. 11, 2007; 18 pages.

USPTO Final Rejection for U.S. Appl. No. 09/989,777 dated Mar. 13, 2007; 24 pages.
USPTO Non-Final Rejection for U.S. Appl. No. 09/989,777 dated Sep. 13, 2006; 18 pages.
USPTO Non-Final Rejection for U.S. Appl. No. 09/989,777 dated Apr. 11, 2006; 21 pages.
USPTO Final Rejection for U.S. Appl. No. 09/989,777 dated Dec. 21, 2005; 29 pages.
USPTO Non-Final Rejection for U.S. Appl. No. 09/989,777 dated Jul. 5, 2005; 36 pages.
USPTO Notice of Allowance for U.S. Appl. No. 09/994,601 dated Dec. 22, 2008; 15 pages.
USPTO Final Rejection for 09/994,601 dated Apr. 17, 2008; 24 pages.
U.S. Appl. No. 10/033,027: "Microcontrollable Programmable System on a Chip;" Snyder; 117 pages.
U.S. Appl. No. 10/803,030: "Programmable Microcontrollable Architecture (Mixed Analog/Digital);" Snyder; 13 pages.
"New Object Domain R3 Beta Now Available (Build 134)!" Mar. 13, 2001; <http://web.archive.org/web/200100331202605/www.objectdomain.com/domain30/index.html>; 2 pages.
"OMG XML Metadata Interchange (XMI) Specifications" 2000; 17 pages.
Electronic Tools Company; E-Studio User Manuel; 2000; retrieved from http://web.archive.org for site http://e-tools.com on Mar. 23, 2005; 77 pages.
Cover Pages Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press; 5th Edition; 3 pages.
Wikipedia "XLM" retrieved on Jan. 29, 2007 from http://en.wikipedia.org/wiki/XML; 16 pages.
"VHDL Samples" retrieved on Jan. 29, 2007 from http://www.csee.umbc.edu/help/VHDL/sarnples/samples.shtml; 10 pages.
Anonymous, "Lotus Notes FAQ—How do you generate unique document numbers?" Sep. 19, 1999; retrieved from www.keysolutions.com on Jul. 9, 2008; 1 page.
Ashok Bindra, "Programmable SoC Delivers A New Level Of System Flexibility"; Electronic Design; Nov. 6, 2000; 11 pages.
Cypress MicroSystem, Inc. "Cypres Customer Forums" retrieved from <http://www.cypress.com/forums/messageview>; 1 page.
Cypress MicroSystem, Inc. "PSoC Designer: Integrated Development Environment User Guide"; Rev. 1.18; Sep. 8, 2003; 193 pages.
Hamblen, "Rapid Prototyping Using Field-Programmable Logic Devices" Jun. 2000, IEEE; 9 pages.
USPTO Final Rejection for U.S. Appl. No. 09/943,062 dated Apr. 30, 2004; 9 pages.
Snyder et al., "Xilinx's A-to-Z Systems Platform" Cahners Microprocessor, The Insider's Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Dec. 8, 2003; 9 pages.
USPTO Advisory Action for U.S. Appl. No. 09/943,062 dated Sep. 25, 2003; 3 pages.
USPTO Final Rejection for U.S. Appl. No. 09/943,062 dated Jun. 27, 2003; 8 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Sep. 11, 2002; 9 pages.
"PSoC Designer; Integrated Development Environment" User Guide; Revision 1.11; Last Revised Jul. 17, 2001; 109 pages.
Cypress Microsystems, "Cypress Microsystems Unveils Programmable System-on-a-Chip for Embedded Internet, Communications and Consumer Systems;" 2000, <http://www.cypressmicro.com/corporate/CY_Announces_nov_13_2000.html>; 3 pages.
Huang et al., ICEBURG, An Embedded In-Circuit Emulator Synthesizer for Microcontrollers, Proceedings of the 36th Design Automation Conference 1999; 6 pages.

Yoo et al., "Fast Hardware-Software Co-verification by Optimistic Execution of Real Processor," Proceedings of Design, Automation and Test in Europe Conference and Exhibition 2000; 6 pages.
USPTO Advisory Action for U.S. Appl. No. 09/943,062 dated Mar. 27, 2008; 3 pages.
USPTO Final Rejection for U.S. Appl. No. 09/943,062 dated Jan. 18, 2008; 8 pages.
USPTO Non-Final Rejection for U.S. Appl. No. 09/943,062 dated Jun. 22, 2007; 12 pages.
USPTO Miscellaneous Action for U.S. Appl. No. 09/943,062 dated Jan. 30, 2006; 2 pages.
USPTO Notice of Allowance for U.S. Appl. No. 10/113,064 dated Sep. 21, 2006; 7 pages.
USPTO Non-Final Rejection for U.S. Appl. No. 10/113,064 dated Apr. 6, 2006; 19 pages.
USPTO Final Rejection for U.S. Appl. No. 10/113,064 dated Oct. 18, 2005; 22 pages.
USPTO Non-Final Rejection for U.S. Appl. No. 10/113,064 dated Apr. 25, 2005; 15 pages.
U.S. Appl. No. 10/113,064: "Method and System for Debugging through Supervisory Operating Codes and Self Modifying Codes," Roe et al.; 36 pages.
USPTO Notice of Allowance for U.S. Appl. No. 09/930,021 dated Nov. 26, 2004; 4 pages.
USPTO Final Rejection for U.S. Appl. No. 09/930,021 dated Aug. 31, 2004; 8 pages.
USPTO Non-Final Rejection for U.S. Appl. No. 09/930,021 dated Apr. 26, 2004; 6 pages.
USPTO Miscellaneous Action with SSP for U.S. Appl. No. 09/930,021 dated Oct. 1, 2001; 1 page.
USPTO Notice of Allowance for U.S. Appl. No. 09/953,423 dated Jul. 12, 2004; 6 pages.
USPTO Non-Final Rejection for U.S. Appl. No. 09/953,423 dated Feb. 6, 2004; 5 pages.
USPTO Notice of Allowance for U.S. Appl. No. 09/957,084 dated May 18, 2004; 5 pages.
USPTO Final Rejection for U.S. Appl. No. 09/957,084 dated Jan. 29, 2004; 8 pages.
USPTO Non-Final Rejection for U.S. Appl. No. 09/957,084 dated Aug. 27, 2003; 8 pages.
USPTO Final Rejection for U.S. Appl. No. 09/957,084 dated Apr. 23, 2003; 8 pages.
USPTO Non-Final Rejection for U.S. Appl. No. 09/957,084 dated Aug. 23, 2002; 6 pages.
USPTO Notice of Allowance for U.S. Appl. No. 09/969,313 dated Oct. 4, 2005; 6 pages.
USPTO Non-Final Rejection for U.S. Appl. No. 09/969,313 dated May 6, 2005; 9 pages.
USPTO Requirement for Restriction/Election for U.S. Appl. No. 09/969,313 dated Mar. 18, 2005; 6 pages.
USPTO Notice of Allowance for U.S. Appl. No. 09/969,311 dated Mar. 1, 2005; 4 pages.
USPTO Non-Final Rejection for U.S. Appl. No. 09/969,311 dated Sep. 21, 2004; 4 pages.
USPTO Advisory Action for U.S. Appl. No. 09/969,311 dated Jul. 21, 2003; 2 pages.
USPTO Final Rejection for U.S. Appl. No. 09/969,311 dated Apr. 7, 2003; 7 pages.
USPTO Non-Final Rejection for U.S. Appl. No. 09/969,311 dated Nov. 6, 2002; 8 pages.
USPTO Notice of Allowance for U.S. Appl. No. 09/972,319 dated Dec. 30, 2004; 4 pages.
USPTO Non-Final Rejection for U.S. Appl. No. 09/972,319 dated Sep. 16, 2004; 9 pages.
USPTO Notice of Allowance for U.S. Appl. No. 09/972,003 dated Jul. 14, 2004; 4 pages.
USPTO Requirement for Restriction/Election for U.S. Appl. No. 09/972,003 dated May 6, 2004; 4 pages.
USPTO Non-Final Rejection for U.S. Appl. No. 09/972,003 dated Feb. 2, 2004; 10 pages.
USPTO Non-Final Rejection for U.S. Appl. No. 09/972,003 dated Aug. 19, 2003; 11 pages.
USPTO Notice of Allowance for U.S. Appl. No. 09/972,133 dated Jun. 9, 2006; 6 pages.
USPTO Final Rejection for U.S. Appl. No. 09/972,133 dated Mar. 30, 2006; 8 pages.
USPTO Non-Final Rejection for U.S. Appl. No. 09/972,133 dated Nov. 25, 2005; 9 pages.
USPTO Advisory Action for U.S. Appl. No. 09/972,133 dated Aug. 31, 2005; 3 pages.
USPTO Final Rejection for U.S. Appl. No. 09/972,133 dated Jun. 29, 2005; 10 pages.
USPTO Non-Final Rejection for U.S. Appl. No. 09/972,133 dated Mar. 8, 2005; 9 pages.
USPTO Notice of Allowance for U.S. Appl. No. 09/975,104 dated Oct. 19, 2006; 6 pages.
USPTO Non-Final Rejection for Application No. 09/975,104 (CD00183) dated Jun. 16, 2006; 8 pages.
USPTO Final Rejection for U.S. Appl. No. 09/975,104 dated Feb. 15, 2006; 7 pages.
USPTO Non-Final Rejection for U.S. Appl. No. 09/975,104 dated Aug. 16, 2005; 6 pages.
USPTO Non-Final Rejection for U.S. Appl. No. 09/975,104 dated Mar. 21, 2005; 7 pages.
USPTO Notice of Allowance for U.S. Appl. No. 09/975,030 dated Feb. 6, 2006; 7 pages.
USPTO Non-Final Rejection for U.S. Appl. No. 09/975,030 dated Oct. 20, 2005; 7 pages.
USPTO Non-Final Rejection for U.S. Appl. No. 09/975,030 dated Mar. 29, 2005; 13 pages.
USPTO Notice of Allowance for U.S. Appl. No. 09/977,111 dated Sep. 28, 2006; 6 pages.
USPTO Notice of Allowance for U.S. Appl. No. 10/272,231 dated Mar. 8, 2004; 6 pages.
USPTO Final Rejection for U.S. Appl. No. 10/272,231 dated Nov. 5, 2003; 5 pages.
USPTO Non-Final Rejection for U.S. Appl. No. 10/272,231 dated Jul. 14, 2003; 6 pages.
USPTO Notice of Allowance for U.S. Appl. No. 11/125,554 dated Feb. 7, 2008; 4 pages.
USPTO Notice of Allowance for U.S. Appl. No. 11/125,554 dated Apr. 24, 2007; 7 pages.
USPTO Non-Final Rejection for U.S. Appl. No. 11/125,554 dated Dec. 11, 2006; 9 pages.
USPTO Notice of Allowance for U.S. Appl. No. 09/855,868 dated Apr. 25, 2005; 6 pages.
USPTO Non-Final Rejection for U.S. Appl. No. 09/855,868 dated Aug. 26, 2004; 7 pages.
USPTO Notice of Allowance for U.S. Appl. No. 09/887,923 dated Sep. 27, 2004; 5 pages.
USPTO Non-Final Rejection for U.S. Appl. No. 09/887,923 dated May 25, 2004; 7 pages.
USPTO Notice of Allowance for U.S. Appl. No. 09/875,599 dated Oct. 17, 2006; 4 pages.
USPTO Non-Final Rejection for U.S. Appl. No. 09/875,599 dated May 31, 2006; 18 pages.
USPTO Final Rejection for U.S. Appl. No. 09/875,599 dated Feb. 15, 2006; 18 pages.
USPTO Final Rejection for U.S. Appl. No. 09/875,599 dated Nov. 21, 2005; 16 pages.
USPTO Advisory Action for U.S. Appl. No. 09/875,599 dated Jun. 8, 2005; 3 pages.
USPTO Final Rejection for U.S. Appl. No. 09/875,599 dated Mar. 29, 2005; 20 pages.
USPTO Non-Final Rejection for U.S. Appl. No. 09/875,599 dated Dec. 3, 2004; 16 pages.
USPTO Final Rejection for U.S. Appl. No. 09/875,599 dated Aug. 25, 2004; 17 pages.
USPTO Final Rejection for U.S. Appl. No. 09/875,599 dated Apr. 26, 2004; 15 pages.
USPTO Non-Final Rejection for U.S. Appl. No. 09/875,599 dated Oct. 27, 2003; 13 pages.
USPTO Notice of Allowance for U.S. Appl. No. 10/004,197 dated Feb. 9, 2007; 7 pages.

USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2006; 9 pages.
USPTO Final Rejection for U.S. Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 09/893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for U.S. Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores," IEEE; 6 pages.
Ghosh et al., "A Low Overhead Design for Testability and Test Generation Technique for Core-based Systems," IEEE, 1997; 10 pages.
Zorian, "Test Requirements for Embedded Core-based Systems and IEEE P1500," IEEE, 1997; 9 pages.
Zorian et al., "Testing Embedded-Core Based System Chips," IEEE, 1998; 14 pages.
Papachristou et al., "Microprocessor Based Testing for Core-Based System on a Chip," IEEE, 1999; 6 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, 2000; 7 pages.
York et al., "On-chip Support Needed for SOC Debug," Electronic Engineering Times, 1999; 2 pages.
Atmel Corporation: AT90SC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled," Derwent Information LTD; 2002; 2 pages.
Morrison, "IBM Eyes Merchant Packaging Services," Jul. 13, 1998; Electronic News <http://www.findarticles.com>; 4 pages.
Charles, Jr. et al., "Wirebonding: Reinventing the Process for MCMs," Apr. 1998; IEEE 7th International Conference on Multichip Modules and High Density Packaging; 3 pages.
Tran et al., "Fine Pitch and Wirebonding and Reliability of Aluminum Capped Copper Bond Pads," May 2000, IEEE Electronic Components and Technology Conference; 8 pages.
Song et al., "A 50% Power Reduction Scheme for CMOS Relaxation Oscillator," IEEE, 1999; 4 pages.
"Electronic Circuit Protector-Circuit Breaker;" IBM Technical Disclosure Bulletin; vol. 36, Issue 8, Aug. 1, 1993; 1 page.
USPTO Final Rejection for U.S. Appl. No. 10/001,478 dated Apr. 20, 2009; 16 pages.
USPTO Notice of Allowance for U.S. Appl. 09/994,600 dated Apr. 3, 2009; 5 pages.
USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.

USPTO Notice of Allowance for U.S. Appl. No. 09/989,762 dated Mar. 25, 2009; 7 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 09/989,762 dated Jan. 26, 2007; 13 pages.
USPTO Non-Final Rejection for U.S. Appl. No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
U.S. Appl. No. 09/275,336: "Programmable Oscillator Scheme;" Mar et al.; 25 pages.
U.S. Appl. No. 09/721,316: "Programmable Oscillator Scheme;" Mar et al.; 26 pages.
U.S. Appl. No. 10/324,455: "Programmable Oscillator Scheme;" Mar et al.; 23 pages.
U.S. Appl. No. 09/998,859: "A System and a Method for Checking Lock Step Consistency between in Circuit Emulation and a Microcontroller while Debugging Process is in Progress;" Nemecek; 33 pages.
U.S. Appl. No. 09/998,834: "A System and a Method for Communication between and Ice and a Production Microcontroller while in a Halt State;" Nemecek; 33 pages.
U.S. Appl. No. 10/113,065: "System and Method for Automatically Matching Components in a Debugging System;" Nemecek et al.; 32 pages.
U.S. Appl. No. 09/989,574: "Method and System for using a Graphics user Interface for Programming an Electronic Device;" Bartz et al.; 43 pages.
U.S. Appl. No. 09/989,816: "Datasheet Browsing and Creation with Data-Driven Datasheet Tabs within a Microcontroller Design Tool;" Bartz et al.; 55 pages.
U.S. Appl. No. 09/989,815: "A Data Driven Method and System for Monitoring Hardware Resource Usage for Programming an Electric Device;" Bartz et al.; 36 pages.
U.S. Appl. No. 11/850,260: "Circuit and Method for Improving the Accuracy of a Crystal-less Oscillator Having Dual-Frequency Modes;" Wright et al.; 33 pages.
USPTO Non-Final Rejection for U.S. Appl. No. 11/850,260 dated Mar. 6, 2009; 7 pages.
USPTO Non-Final Rejection for U.S. Appl. No. 11/644,100 dated Mar. 9, 2009; 11 pages.
USPTO Advisory Action for U.S. Appl. No. 11/644,100 dated Feb. 9, 2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for U.S. Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
USPTO Non-Final Rejection for U.S. Appl. No. 10/226,911 dated Mar. 19, 2004; 6 pages.
U.S. Appl. No. 11/415,588; "Voltage Controlled Oscillator Delay Cell and Method," Sivadasan; 24 pages.
U.S. Appl. No. 12/218,404: "Voltage Controlled Oscillator Delay Cell and Method," Sivadasan; 23 pages.
USPTO Notice of Allowance for U.S. Appl. No. 11/132,894 dated Apr. 26, 2007; 4 pages.
USPTO Non-Final Rejection for U.S. Appl. No. 11/132,894 dated Dec. 19, 2006; 12 pages.
U.S. Appl. No. 11/132,894: "Open Loop Bandwidth Test Architecture and Method for Phase Locked Loop (PLL)," Stiff, 38 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
U.S. Appl. No. 11/322,044: "Split charge pump PLL architecture," Stiff; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
U.S. Appl. No. 10/305,589; "Current Controlled Delay Circuit," Stiff; 18 pages.
U.S. Appl. No. 09/849,164: "Reduced Static Phase Error CMOS PLL Charge Pump," Stiff; 30 pages.
Maneatis, "Low-Jitter Process-Independent DLL and PLL Based on Self-Biased Techniques," IEEE Journal of Solid-State Circuits, vol. 31, No. 11, Nov. 1996; 10 pages.
Larsson, "A 2-1600-MHz CMOS Clock Recovery PLL with Low-Vdd Capability," IEEE Journal of Solid-State Circuits, vol. 34, No. 12, Dec. 1999; 10 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
U.S. Appl. No. 10/327,217: "Single Ended Clock Signal Generator Having a Differential Output," Richmond et al.; 27 pages.
USPTO Notice of Allowance for U.S. Appl. No. 10/871,582 dated Mar. 30, 2006; 6 pages.
USPTO Final Rejection for U.S. Appl. No. 10/871,582 dated Feb. 1, 2006; 5 pages.
USPTO Non-Final Rejection for U.S. Appl. No. 10/871,582 dated Sep. 7, 2005; 7 pages.
U.S. Appl. No. 10/871,582: "LVDS Input Circuit with Extended Common Mode Range," Reinschmidt et al.; 25 pages.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
U.S. Appl. No. 09/404,891: "Method, Architecture and Circuitry for Controlling Pulse Width in a Phase and/or Frequency Detector," Scott et al,; 17 pages.
USPTO Notice of Allowance for U.S. Appl. No. 10/226,911 dated Aug. 20, 2004; 4 pages.
U.S. Appl. No. 10/226,911: "Calibration of Integrated Circuit Time Constants," Gehring et al.; 32 pages.

USPTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
U.S. Appl. No. 09/943,149: "Method for Phase Locking in a Phase Lock Loop," Moyal et al.; 21 pages.
Durham et al., "Integrated Continuous-Time Balanced Filters for 16-bit DSP Interfaces," IEEE, 1993; 6 pages.
Durham et al., "Circuits Architectures for High Linearity Monolithic Continuous-Time Filtering," IEEE, 1992, 7 pages.
Durham et al., "High-Linearity Conitnuous-Time Filter in 5-V VLSI CMOS," IEEE, 1992; 8 pages.
U.S. Appl. No. 09/047,595: "Roving Range Control to Limit Receive PLL Frequency of Operation," Scott; 35 pages.
U.S. Appl. No. 09/216,460: "Circuit and Method for Controlling an Output of a Ring Oscillator," Abugharbieh et al.; 21 pages.
U.S. Appl. No. 09/471,914: "Reference-Free Clock Generator and Data Recovery PLL," Dalma et al.; 32 pages.
U.S. Appl. No. 09/471,576: "Reference-Free Clock Generation and Data Recovery PLL," Dalmia; 30 pages.
U.S. Appl. No. 10/083,442: "Method/Architecture for a Low Gain PLL with Wide Frequency Range," Meyers et al.; 28 pages.
U.S. Appl. No. 09/470,665: "Digital Phase/Frequency Detector, and Clock Generator and Data Recovery PLL Containing the Same," Dalmia; 26 pages.
U.S. Appl. No. 09/893,161: "Architecture of a PLL with Dynamic Frequency Control on a PLD," Moore; 32 pages.
U.S. Appl. No. 09/608,753: "PLL Lockout Watchdog," Wilson et al.; 24 pages.
U.S. Appl. No. 09/398,956: "Frequency Acquistion Rate Control in Phase Lock Loop Circuits," Moyal et al.; 35 pages.
U.S. Appl. No. 09/747,262: "Linearized Digital Phase-Locked Loop," Williams et al.; 9 pages.
U.S. Appl. No. 09/981,448: "Oscillator Tuning Method," Hauck: 28 pages.
U.S. Appl. No. 09/538,989: "Memory Based Phase Locked Loop," Krishnan; 27 pages.
U.S. Appl. No. 09/048,905: "Programmable Clock Generator," Mann et al.; 42 pages.
U.S. Appl. No. 08/865,342: "Programmable Clock Generator," Mann et al.; 41 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
U.S. Appl. No. 10/293,392: "Low Voltage Receiver Circuit and Method for Shifting the Differential Input Signals of the Receiver Depending on a Common Mode Voltage of the Input Signals," Maher et al.; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004; 6 pages.
USPTO Non-Final Rejection for U.S. Appl. No. 10/288,003 dated Apr. 7, 2004; 9 pages.
U.S. Appl. No. 10/288,003: "Low Voltage Differential Signal Driver Circuit and Method," Roper et al.; 30 pages.
USPTO Notice of Allowance for U.S. Appl. No. 09/989,777 dated Jun. 9, 2009; 7 pages.
USPTO Notice of Allowance for U.S. Appl. No. 10/238,966 dated Aug. 5, 2009; 5 pages.
USPTO Notice of Allowance for U.S. Appl. No. 10/033,027 dated Sep. 2, 2009; 4 pages.
USPTO Non-Final Rejection for U.S. Appl. No. 10/001,478 dated Aug. 4, 2009; 17 pages.
USPTO Advisory Action for U.S. Appl. No. 10/001,478 dated Jun. 30, 2009; 3 pages.
USPTO Final Rejection for U.S. Appl. No. 09/989,767 dated Dec. 7, 2009; 22 pages.
USPTO Notice of Allowance for U.S. Appl. No. 10/002,217 dated Sep. 17, 2009; 6 pages.
USPTO Notice of Allowance for U.S. Appl. No. 10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages.
USPTO Ex Parte Quayle Action for U.S. Appl. No. 09/975,115 dated Aug. 20, 2009; 7 pages.
USPTO Non-Final Rejection for U.S. Appl. No. 09/994,601 dated Jul. 9, 2009; 11 pages.
USPTO Non-Final Rejection for U.S. Appl. No. 11/818,005 dated Nov. 23, 2009; 8 pages.
USPTO Requirement for Restriction/Election for U.S. Appl. No. 11/818,005 dated Jul. 14, 2009; 5 pages.
USPTO Advisory Action for U.S. Appl. No. 09/989,778 dated Jun. 17, 2009; 3 pages.
USPTO Notice of Allowance for U.S. Appl. No. 09/994,600 dated Aug. 25, 2009; 4 pages.
USPTO Notice of Allowance for U.S. Appl. No. 09/994,600 dated Apr. 3, 2009; 5 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009; 4 pages.
USPTO Notice of Allowance for U.S. Appl. No. 09/989,777 dated Aug. 6, 2009; 8 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 12/218,404 dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.

USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/850,260 dated Aug. 21, 2009; 9 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Notice of Allowance for U.S. Appl. No. 10/033,027 dated Feb. 18, 2010; 4 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 11/709,866 dated Feb. 16, 2010; 7 pages.
USPTO Non-Final Rejection for U.S. Appl. No. 10/113,581 dated Aug. 12, 2005; 12 pages.
USPTO Notice of Allowance for U.S. Appl. No. 10/113,581 dated Mar. 5, 2010; 9 pages.
USPTO Non-Final Rejection for U.S. Appl. No. 10/113,581 dated Sep. 1, 2009; 18 pages.
USPTO Final Rejection for U.S. Appl. No. 10/113,581 dated May 11, 2009; 21 pages.
USPTO Non-Final Rejection for U.S. Appl. No. 10/113,581 dated Nov. 26, 2008; 20 pages.
USPTO Final Rejection for U.S. Appl. No. 10/113,581 dated Jun. 11, 2008; 14 pages.
USPTO Non-Final Rejection for U.S. Appl. No. 10/113,581 dated Nov. 27, 2007; 15 pages.
USPTO Final Rejection for U.S. Appl. No. 10/113,581 dated Jul. 13, 2007; 15 pages.
USPTO Non-Final Rejection for U.S. Appl. No. 10/113,581 dated Jan. 10, 2007; 14 pages.
USPTO Final Rejection for U.S. Appl. No. 10/113,581 dated Aug. 10, 2006; 13 pages.
USPTO Non-Final Rejection for Application No. 10/113,581 dated Feb. 24, 2006; 11 pages.
USPTO Advisory Action for U.S. Appl. No. 09/994,601 dated Mar. 23, 2010; 2 pages.
USPTO Notice of Allowance for U.S. Appl. No. 12/057,149 dated Nov. 30, 2010; 7 pages.
USPTO Final Rejection for U.S. Appl. No. 12/060,176 dated Oct. 12, 2010; 22 pages.
USPTO Notice of Allowance for U.S. Appl. No. 09/998,848 dated Oct. 13, 2010; 4 pages.
USPTO Non-Final Rejection for U.S. Appl. No. 09/998,848 dated Jun. 21, 2010; 15 pages.
USPTO Advisory Action for U.S. Appl. No. 09/998,848 dated Feb. 24, 2010; 3 pages.
USPTO Non-Final Rejection for U.S. Appl. No. 09/989,767 dated Jul. 9, 2010; 22 pages.
USPTO Non-Final Rejection for U.S. Appl. No. 09/989,771 dated Jul. 20, 2010; 12 pages.
USPTO Advisory Action for U.S. Appl. No. 09/989,771 dated Feb. 3, 2010; 3 pages.
USPTO Miscellaneous Action for U.S. Appl. No. 10/113,581 dated Jun. 12, 2010; 6 pages.
USPTO Notice of Allowance for U.S. Appl. No. 10/113,581 dated Sep. 3, 2010; 11 pages.
USPTO U.S. Appl. No. 11/273,708: "Capacitance Sensor Using Relaxation Oscillators," Snyder et al., filed on Nov. 14, 2005; 33 pages.
USPTO Non-Final Rejection for U.S. Appl. No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/273,708 dated Aug. 9, 2007; 4 pages.
USPTO U.S. Appl. No. 11/337,272: "Successive Approximate Capacitance Measurement Circuit," Warren Snyder, filed on Jan. 20, 2006 29 pages.
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 11/337,272 dated Feb. 2, 2007; 11 pages.
USPTO Advisory Action for U.S. Appl. No. 11/337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.
USPTO U.S. Appl. No. 11/983,291: "Successive Approximate Capacitance Measurement Circuit," Warren Snyder, filed on Nov. 7, 2007; 26 pages.
USPTO Non-Final Rejection for U.S. Appl. No. 11/983,291 dated Mar. 9, 2009; 9 pages.
USPTO U.S. Appl. No. 11/698,660: "Configurable Bus," Kutz et al., filed on Jan. 25, 2007; 35 pages.
USPTO Non-Final Rejection for 11/698,660 dated Dec. 2, 2008; 12 pages.
USPTO Final Rejection for U.S. Appl. No. 11/698,660 dated May 28, 2009; 12 pages.
USPTO U.S. Appl. No. 11/709,866: "Input/Output Multiplexer Bus," Dennis Sequine, filed on Feb. 21, 2007; 33 pages.
USPTO Non-Final Rejection for U.S. Appl. No. 11/709,866 dated Nov. 7, 2008; 14 pages.
USPTO Notice of Allowance for U.S. Appl. No. 11/709,866 dated Apr. 7, 2009; 8 pages.
Sedra et al., "Microelectronic Circuits," 3rd Edition, 1991, Oxford University Press, Feb. 5, 2007; 20 pages.

Van Ess, David; "Simulating a 555 Timer with PSoC," Cypress Semiconductor Corporation, Application Note AN2286, May 19, 2005; 10 pages.
Cypress Semiconductor Corporation, "FAN Controller CG6457AM and CG6462AM," PSoC Mixed Signal Array Preliminary Data Sheet; May 24, 2005; 25 pages.
Cypress Semiconductor Corporation, "PSoC Mixed-Signal Controllers," Production Description; <http://www.cypress.com/portal/server>, retrieved on Sep. 27, 2005; 2 pages.
Cypress Semiconductor Corporation, "CY8C21x34 Data Sheet," CSR User Module, CSR V.1.0; Oct. 6, 2005; 36 pages.
Chapweske, Adam; "The PS/2 Mouse Interface," PS/2 Mouse Interfacing, 2001, retrieved on May 18, 2006; 11 pages.
Cypress Semiconductor Corporation, "Cypress Introduces PSoC(™)-Based Capacitive Touch Sensor Solution," Cypress Press Release; May 31, 2005; <http://www.cypress.com/portal/server>; retrieved on Feb. 5, 2007; 4 pages.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan., 24, 2007; 3 pages.
Cypress Semiconductor Corporation, "PSoC CY8C20x34 Technical Reference Manual (TRM)," PSoC CY8C20x34 TRM, Version 1.0, 2006; 220 pages.
USPTO U.S. Appl. No. 11/166,622: "Touch wake for electronic devices," Beard et al., filed on Jun. 23, 2005; 22 pages.
International Written Opinion of the International Searching Authority for International Application No. PCT/US2006/09572 dated Jan. 10, 2008; 5 pages.
International Search Report for International Application No. PCT/US2006/09572 dated Jan. 10, 2008; 2 pages.
USPTO Notice of Allowance for U.S. Appl. No. 10/024,093 dated Sep. 10, 2002; 7 pages.
USPTO U.S. Appl. No. 10/024,093: "Configurable Memory for Programmable Logic Circuits," Lacey et al., filed on Dec. 18, 2001; 25 pages.
USPTO U.S. Appl. No. 11/088,028: "Method and Circuit for Rapid Alignment of Signals," Moyal et al., filed on Nov. 13, 2007; 34 pages.
USPTO Notice of Allowance for U.S. Appl. No. 11/088,028 dated Jul. 2, 2007; 6 pages.
USPTO Notice of Allowance for U.S. Appl. No. 11/088,028 dated Jan. 26, 2007; 6 pages.
USPTO Non-Final Rejection for 11/088,028 dated Jun. 16, 2006; 8 pages.
USPTO U.S. Appl. No. 11/985,340: "Method and Circuit for Rapid Alignment of Signals," Moyal et al., filed on Nov. 13, 2007; 34 pages.
USPTO Notice of Allowance for U.S. Appl. No. 11/985,340 dated Jun. 2, 2009; 7 pages.
USPTO Requirement for Restriction for U.S. Appl. No. 11/985,340 dated Mar. 16, 2009; 7 pages.
Kory Hopkins, "Definition," Jan. 16, 1997; <http://www.cs.sfu.ca/cs/people/GradStudent.html>; 1 page.
Ebeling et al., "Validating VLSI Circuit Layout by Wirelist Comparison," Sep. 1983; in proceedings of the IEEE International Conference on Computer Aided Design (ICCAD-83); 2 pages.
"The Gemini Netlist Comparison Project," <http://www.cs.washington.edukesearch/projects/lis/www/gemini/gemini.html> larry@cs.washington.edu; Mar. 19, 2002; 2 pages.
Ohlrich et al., "Sub-Gemini: Identifying Subcircuits using a Fast Subgraph Isomorphism Algorithm," Jun. 1993; in proceedings of the 30th IEEE/ACM Design Automation Conference; 7 pages.
Ebling, "Gemini II: A Second Generation Layout Validation Program," 1988; in proceedings of the IEEE International Conference on Computer Aided Design (ICCAD-88); 4 pages.
USPTO U.S. Appl. No. 12/132,527: "System and Method for Performing Next Placements and Pruning of Disallowed Placements for Programming an Integrated Circuit," Ogami et al., filed on Jun. 3, 2008; 44 pages.

USPTO U.S. Appl. No. 12/356,468: "System and Method for Dynamically Generating a Configuration Datasheet," Anderson et al.; filed on Jan. 20, 2009; 27 pages.
Written Opinion of the International Search Authority for International Application No. PCT/US08/60680 dated Aug. 15, 2008; 4 pages.
USPTO Notice of Allowance for U.S. Appl. No. 09/475,879 dated Oct. 22, 2004; 7 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
USPTO U.S. Appl. No. 09/475,879: "Programmable Logic Device," Lacey et al.; filed on Dec. 30, 1999; 50 pages.
USPTO U.S. Appl. No. 09/475,808: "Configurable Memory for Programmable Logic Circuits," Lacey et al., filed on Dec. 30, 1999; 24 pages.
USPTO Non-Final Rejection for U.S. Appl. No. 09/475,808 dated Jun. 6, 2001; 8 pages.
USPTO Notice of Allowance for U.S. Appl. No. 09/475,808 dated Nov. 6, 2001; 8 pages.
USPTO U.S. Appl. No. 10/137,497: "Reconfigurable Testing System and Method," Pleis et al.; filed on May 1, 2002; 40 pages.
USPTO Non-Final Rejection for U.S. Appl. No. 10/137,497 dated Nov. 5, 2004; 17 pages.
USPTO Final Rejection for U.S. Appl. No. 10/137,497 dated May 5, 2005; 13 pages.
USPTO Non-Final Rejection for U.S. Appl. No. 10/137,497 dated Sep. 22, 2005; 21 pages.
USPTO Final Rejection for U.S. Appl. No. 10/137,497 dated Mar. 13, 2006; 15 pages.
USPTO Non-Final Rejection for U.S. Appl. No. 10/137,497 dated Aug. 2, 2006; 21 pages.
USPTO Notice of Allowance for U.S. Appl. No. 10/137,497 dated Jan. 24, 2007; 12 pages.
USPTO Notice of Allowance for U.S. Appl. No. 10/137,497 dated Jul. 20, 2007; 4 pages.
USPTO U.S. Appl. No. 10/653,050: "Method and System for Programming a Memory Device," Snyder et al.; filed on Aug. 29, 2003; 69 pages.
USPTO Non-Final Rejection for U.S. Appl. No. 10/653,050 dated Apr. 6, 2004; 7 pages.
USPTO Notice of Allowance for U.S. Appl. No. 10/653,050 dated Jul. 29, 2004; 3 pages.
USPTO U.S. Appl. No. 10/172,670: "Method and System for Programming a Memory Device," Snyder et al.; filed on Jun. 13, 2002; 66 pages.
USPTO U.S. Appl. No. 11/986,338: Reconfigurable Testing System and Method, Pleis et al., filed on Nov. 20, 2007; 41 pages.
USPTO Notice of Allowance for U.S. Appl. No. 11/965,291 dated May 5, 2009; 7 pages.
USPTO Non-Final Rejection for U.S. Appl. No. 11/965,291 dated Dec. 17, 2008; 8 pages.
USPTO U.S. Appl. No. 11/965,291: "Universal Digital Block Interconnection and Channel Routing," Snyder et al., filed on Dec. 27, 2007; 31 pages.
USPTO Notice of Allowance for U.S. Appl. No. 11/986,338 dated May 7, 2009; 1 page.
USPTO Non-Final Rejection for U.S. Appl. No. 12/058,534 dated Jan. 11, 2011; 17 pages.
USPTO Non-Final Rejection for U.S. Appl. No. 12/004,833 dated Dec. 21, 2010; 8 pages.
USPTO Requirement Restriction for U.S. Appl. No. 12/004,833 dated Sep. 22, 2010; 6 pages.
U.S. Appl. No. 12/058,586; "System and Method for Monitoring a Target Device," Kenneth Ogami et al. filed on Mar. 28, 2008; 56 pages.
USPTO Notice of Allowance for U.S. Appl. No. 10/118,682 dated Apr. 3, 2006; 4 pages.

USPTO Final Rejection for U.S. Appl. No. 10/118,682 dated Oct. 12, 2005; 11 pages.
USPTO Non-Final Rejection for U.S. Appl. No. 10/118,682 dated Jun. 16, 2005; 12 pages.
USPTO Requirement Restriction for U.S. Appl. No. 10/118,682 dated Apr. 28, 2005; 4 pages.
USPTO Non-Final Rejection for U.S. Appl. No. 10/118,682 dated Jan. 12, 2005; 11 pages.
USPTO Non-Final Rejection for U.S. Appl. No. 10/118,682 dated Sep. 24, 2004; 8 pages.
USPTO Final Rejection for U.S. Appl. No. 10/118,682 dated May 3, 2004; 8 pages.
USPTO Non-Final Rejection for U.S. Appl. No. 10/118,682 dated Feb. 25, 2004; 9 pages.
USPTO Non-Final Rejection for U.S. Appl. No. 10/118,682 dated Nov. 3, 2003; 8 pages.
USPTO Notice of Allowance for U.S. Appl. No. 10/329,162 dated Jul. 5, 2007; 7 pages.
USPTO Non-Final Rejection for U.S. Appl. No. 10/329,162 dated Jan. 29, 2007; 10 pages.
USPTO Final Rejection for U.S. Appl. No. 10/329,162 dated Aug. 25, 2006; 12 pages.
USPTO Non-Final Rejection for 10/329,162 dated Mar. 10, 2006; 9 pages.
USPTO Final Rejection for U.S. Appl. No. 10/329,162 dated Sep. 21, 2005; 12 pages.
USPTO Non-Final Rejection for U.S. Appl. No. 10/329,162 dated Apr. 21, 2005; 10 pages.
USPTO Advisory Action for U.S. Appl. No. 10/329,162 dated Mar. 29, 2005; 2 pages.
USPTO Final Rejection for U.S. Appl. No. 10/329,162 dated Dec. 15, 2004; 10 pages.
USPTO Non-Final Rejection for U.S. Appl. No. 10/329,162 dated Aug. 2, 2004; 8 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.
USPTO Non-Final Rejection for U.S. Appl. No. 11/799,439 dated Nov. 2, 2007; 7 pages.
USPTO Non-Final Rejection for U.S. Appl. No. 11/799,439 dated May 29, 2008; 8 pages.
USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.
USPTO Notice of Allowance for U.S. Appl. No. 11/799,439 dated Feb. 5, 2010; 4 pages.
USPTO Notice of Allowance for U.S. Appl. No. 11/347,189 dated Sep. 27, 2007; 4 pages.
USPTO Non-Final Rejection for U.S. Appl. No. 11/347,189 dated Jun. 8, 2007; 6 pages.
USPTO Notice of Allowance for U.S. Appl. No. 12/070,547 dated Feb. 24, 2010; 4 pages.
USPTO Final Rejection for U.S. Appl. No. 12/070,547 dated Oct. 30, 2009; 5 pages.
USPTO Non-Final Rejection for U.S. Appl. No. 12/070,547 dated Jun. 3, 2009; 6 pages.
USPTO Non-Final Rejection for U.S. Appl. No. 11/201,922 dated Jun. 11, 2010; 12 pages.
USPTO Notice of Allowance for U.S. Appl. No. 09/943,062 dated Jun. 29, 2010; 4 pages.
USPTO Final Rejection for U.S. Appl. No. 11/818,005 dated May 24, 2010; 8 pages.
USPTO Non-Final Rejection for U.S. Appl. No. 12/132,527 dated Apr. 29, 2010; 7 pages.
USPTO Non-Final Rejection for U.S. Appl. No. 11/698,660 dated Dec. 13, 2010; 20 pages.
USPTO Notice of Allowance for U.S. Appl. No. 11/644,100 dated Jan. 6, 2011; 6 pages.
USPTO Non-Final Rejection for U.S. Appl. No. 11/201,922 dated Dec. 28, 2010; 14 pages.
USPTO Final Rejection for U.S. Appl. No. 11/166,622 dated Dec. 7, 2010; 12 pages.
USPTO Non-Final Rejection for U.S. Appl. No. 11/166,622 dated Jun. 22, 2010; 11 pages.
USPTO Final Rejection for U.S. Appl. No. 09/989,771 dated Jan. 4, 2011; 12 pages.
USPTO Non-Final Rejection for U.S. Appl. No. 09/975,338 dated Apr. 30, 2010; 10 pages.
USPTO Non-Final Rejection for U.S. Appl. No. 11/818,005 dated Oct. 26, 2010; 10 pages.
USPTO Non-Final Rejection for U.S. Appl. No. 11/968,145 dated Jan. 5, 2011; 8 pages.
USPTO Notice of Allowance for U.S. Appl. No. 12/058,569 dated Dec. 13, 2010; 6 pages.
USPTO Final Rejection for U.S. Appl. No. 12/104,678 dated Dec. 3, 2010; 9 pages.
USPTO Final Rejection for U.S. Appl. No. 11/857,947 dated Jan. 4, 2011; 14 pages.
USPTO Notice of Allowance for U.S. Appl. No. 10/256,829 dated May 10, 2010; 4 pages.
USPTO Non-Final Rejection for U.S. Appl. No. 10/256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jan. 7, 2009; 7 pages.
USPTO Non-Final Rejection for U.S. Appl. No. 10/256,829 dated Jun. 26, 2008; 11 pages.
USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 10/256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.
USPTO Final Rejection for U.S. Appl. No. 10/327,207 dated Mar. 2, 2006; 13 pages.
USPTO Non-Final Rejection for U.S. Appl. No. 10/327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.
USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.

USPTO Final Rejection for U.S. Appl. No. 09/989,570 dated May 30, 2003; 9 pages.
USPTO Non-Final Rejection for U.S. Appl. No. 09/989,570 dated Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. Moods Mano, "Computer System Architecture," 1982, Prentice-Hall, 2nd Edition, pp. 261-264 and 435-440; 14 pages.
Dirk Killat, "A One-Chip Solution for Electronic Ballasts in Fluorescent Lamps," Power Electronics, <http://powerelectronics.com/mag/power_onechip_solution_electronic/>, dated Mar. 1, 2004, accessed Sep. 13, 2005; 4 pages.
Fred Eady, "PSoC 101," Circuit Cellar, Aug. 2004, accessed Sep. 13, 2005, <http://www.circuitcellar.com/library/print10804/eady169/2.htm>; 4 pages.
Vixel, "InSpeed SOC 320 Embedded Storage Switch," 2003, Vixel, pp. 1-5; 5 pages.
A.F. Harvey, "DMA Fundamentals on Various PC Platforms," 1991, 1994, National Instruments Corporation, pp. 1-19; 19 pages.
U.S. Appl. No. 12/058,586: "System and Method for Monitoring a Target Device," Ogami et al., filed on Mar. 28, 2008; 41 pages.
U.S. Appl. No. 12/058,534: "System and Method for Controlling a Target Device," Ogami et al., filed on Mar. 28, 2008; 40 pages.
U.S. Appl. No. 12/004,833: "Systems and Methods for Dynamically Reconfiguring a Programmable System on a Chip," Ogami et al., filed on Dec. 21, 2007; 40 pages.
U.S. Appl. No. 121058,569: "Configuration of Programmable IC Design Elements," Best et al., filed on Mar. 28, 2008; 19 pages.
U.S. Appl. No. 12/057,149: "Power Management Architecture, Method and Configuration System," Kenneth Ogami, filed on Mar. 27, 2008; 34 pages.
U.S. Appl. No. 12/765,400: "Autonomous Control in a Programmable System," Sullam et al., filed on Apr. 22, 2010; 30 pages.
International Search Report for International Application No. PCT/US10/33626 mailed Jun. 24, 2010; 3 pages.
The Written Opinion of the International Search Report for International Application No. PCT/US10/33626 mailed Jun. 24, 2010; 5 pages.
USPTO Non-Final Rejection for U.S. Appl. No. 12/060,176 dated Mar. 30, 2010; 22 pages.
John Mangino, "Using DMA with High Performance Peripherals to Maximize System Performance," 2007, Texas Instruments, pp. 1-23; 23 pages.
Balough et al., "White Paper: Comparing IP Integration Approaches for FPGA Implementation," Feb. 2007, Version 1.1, Altera, pp. 1-7; 7 pages.
USPTO Final Rejection for U.S. Appl. No. 09/989,767 dated Jan. 18, 2011; 24 pages.
USPTO Notice of Allowance for U.S. Appl. No. 11/201,627 dated Jan. 20, 2011; 8 pages.
USPTO Non-Final Rejection for U.S. Appl. No. 11/200,619 dated Jan. 31, 2011; 14 pages.
USPTO Non-Final Rejection for U.S. Appl. No. 12/058,569 dated Aug. 2, 2010; 9 pages.
USPTO Miscellaneous Action for U.S. Appl. No. 10/113,581 dated Jun. 23, 2010; 6 pages.
USPTO Non-Final Rejection for U.S. Appl. No. 12/104,678 dated Jul. 2, 2010; 8 pages.
USPTO Final Rejection for U.S. Appl. No. 11/968,145 dated Aug. 2, 2010; 6 pages.
USPTO Notice of Allowance for U.S. Appl. No. 11/985,340 dated Jun. 9, 2010; 8 pages.
USPTO Notice of Allowance for U.S. Appl. No. 11/850,260 dated Jul. 2, 2010; 8 pages.
USPTO Notice of Allowance for U.S. Appl. No. 12/060,128 dated Oct. 19, 2009; 8 pages.

USPTO Miscellaneous Office Action for U.S. Appl. No. 091975,338 dated Apr. 30, 2010; 2 pages.
USPTO Advisory Action for U.S. Appl. No. 11/818,005 dated Jul. 30, 2010; 3 pages.
USPTO Advisory Action for U.S. Appl. No. 11/201,627 dated Aug. 5, 2010; 3 pages.
USPTO Final Rejection for U.S. Appl. No. 11/201,627 dated May 24, 2010; 26 pages.
USPTO Final Rejection for U.S. Appl. No. 11/166,622 dated Mar. 18, 2010; 12 pages.
USPTO Non-Final Rejection for U.S. Appl. No. 11/698,660 dated May 21, 2010; 15 pages.
USPTO Advisory Action for U.S. Appl. No. 11/644,100 dated Jul. 21, 2010; 3 pages.
USPTO Final Rejection for U.S. Appl. No. 11/644,100 dated May 19, 2010; 13 pages.
USPTO Final Rejection for U.S. Appl. No. 11/865,672 dated Dec. 30, 2009; 6 pages.
USPTO Final Rejection for U.S. Appl. No. 11/857,947 dated Oct. 14, 2009; 22 pages.
USPTO Non-Final Rejection for U.S. Appl. No. 11/857,947 dated Feb. 3, 2010; 23 pages.
USPTO Non-Final Rejection for U.S. Appl. No. 11/857,947 dated Jul. 21, 2010; 15 pages.
USPTO Non-Final Rejection for U.S. Appl. No. 11/968,145 dated Mar. 4, 2010; 11 pages.
USPTO Miscellaneous Action for U.S. Appl. No. 10/001,478 dated Feb. 23, 2010; 5 pages.
USPTO Notice of Allowance for U.S. Appl. No. 10/001,478 dated Jun. 2, 2010; 11 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009; 18 pages.
USPTO Non-Final Rejection for U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International Application No. PCT/US08/60695 dated Jul. 22, 2009; 3 pages.
Written Opinion of the International Searching Authority for International Application No. PCT/US08/60695 dated Jul. 22, 2009; 6 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
International Search Report of the International Searching Authority for International Application No. PCT/US08/60696 dated Sep. 22, 2008; 2 pages.
International Search Report of the International Searching Authority for International Application No. PCT/US08/60698 dated Sep. 5, 2008; 2 pages.
Shahbahrami et al., "Matrix Register File and Extended Subwords: Two Techniques for Embedded Media Processors," ACM, May 2005; 9 pages.
Jung et al., "A Register File with Transposed Access Mode," 2000, IEEE; 2 pages.
International Search Report of the International Searching Authority for International Application No. PCT/US08/60681 dated Sep. 12, 2008; 2 pages.

Written Opinion of the International Searching Authority for International Application No. PCT/US08/60681 dated Sep. 12, 2008; 4 pages.

USPTO Notice of Allowance for U.S. Appl. No. 11/965,677 dated Sep. 10, 2009; 6 pages.

USPTO Non-Final Rejection for U.S. Appl. No. 11/965,677 dated Mar. 10, 2009; 10 pages.

Written Opinion of the International Searching Authority for International Application No. PCT/US08/60696 dated Sep. 22, 2008; 4 pages.

USPTO Advisory Action for U.S. Appl. No. 11/779,439 dated Mar. 30, 2009; 3 pages.

USPTO Notice of Allowance for U.S. Appl. No. 10/001,478 dated Sep. 7, 2010; 10 pages.

USPTO Notice of Allowance for U.S. Appl. No. 11/818,005 dated Oct. 26, 2010; 10 pages.

USPTO Final Rejection for U.S. Appl. No. 12/132,527 dated Oct. 14, 2010; 8 pages.

USPTO Non-Final Rejection for U.S. Appl. No. 11/201,627 dated Sep. 30, 2010; 6 pages.

USPTO Final Rejection for U.S. Appl. No. 11/698,660 dated Sep. 3, 2010; 19 pages.

USPTO Advisory Action for U.S. Appl. No. 11/698,660 dated Nov. 10, 2010; 3 pages.

USPTO Non-Final Rejection for U.S. Appl. No. 11/644,100 dated Sep. 15, 2010; 10 pages.

USPTO Advisory Action for U.S. Appl. No. 12/136,577 dated Oct. 29, 2010; 3 pages.

USPTO Notice of Allowance for U.S. Appl. No. 091975,115 dated May 9, 2011; 11 pages.

USPTO Non-Final Rejection for U.S. Appl. No. 10/033,027 dated Mar. 15, 2011; 6 pages.

USPTO Notice of Allowance for U.S. Appl. No. 11/818,005 dated Mar. 23, 2011; 7 pages.

USPTO Requirement Restriction for U.S. Appl. No. 12/356,468 dated Apr. 22, 2011; 7 pages.

U.S. Appl. No. 12/356,468: "System and Method for Dynamically Generating a Configuration Datasheet," Anderson et al., filed on Jan. 20, 2009; 69 pages.

USPTO Notice of Allowance for U.S. Appl. No. 09/998,848 dated Feb. 17, 2011; 7 pages.

USPTO Non-Final Rejection for U.S. Appl. No. 12/136,557 dated May 5, 2011; 7 pages.

USPTO Non-Final Rejection for U.S. Appl. No. 12/789,399 dated Mar. 10, 2011; 14 pages.

U.S. Appl. No. 12/789,399: "Model for a Hardware Device-Independent Method of Defining Embedded Firmware for Programmable Systems," McDonald et al., filed on May 27, 2010; 32 pages.

USPTO Notice of Allowance for U.S. Appl. No. 11/166,622 dated Apr. 15, 2011; 5 pages.

USPTO Final Rejection for U.S. Appl. No. 11/698,660 dated Apr. 4, 2011; 20 pages.

USPTO Notice of Allowance for U.S. Appl. No. 11/865,672 dated Mar. 2, 2011; 8 pages.

USPTO Notice of Allowance for U.S. Appl. No. 11/857,947 dated Mar. 30, 2011; 8 pages.

USPTO Notice of Allowance for U.S. Appl. No. 12/058,569 dated Apr. 11, 2011; 7 pages.

USPTO Non-Final Rejection for U.S. Appl. No. 12/060,176 dated Apr. 6, 2011; 23 pages.

USPTO Notice of Allowance for U.S. Appl. No. 12/104,672 dated Feb. 14, 2011; 9 pages.

USPTO Advisory Action for U.S. Appl. No. 12/104,678 dated Feb. 16, 2011; 5 pages.

* cited by examiner

DIFFERENTIAL-TO-SINGLE ENDED SIGNAL CONVERTER CIRCUIT AND METHOD

This application claims the benefit of U.S. provisional application Ser. No. 60/752,804 filed Dec. 21, 2005, the contents of which are incorporated by reference herein.

TECHNICAL FIELD

The present invention relates generally to electronic circuits, and more particularly to signal converter circuits that can convert one or more received input signals into one or more output signals of a different convention type than the input signal(s).

BACKGROUND OF THE INVENTION

A signal converter circuit can convert input signals having a particular convention (e.g., shape, amplitude, number of phases, and/or offset) for use by other circuits that require a different signal convention. One type of conversion can be from two differential input signals into one single swing output signal.

To better understand various features of the disclosed embodiments, conventional approaches to converting differential input signals into a single ended output signal will first be described.

A conventional solution for differential to single-ended signal conversion can utilize a differential pair based comparator. For example, a conventional differential complementary metal-oxide-semiconductor (CMOS) or bipolar transistor based differential comparator can be used to detect when two differential input signals vary from one another. Such conventional solutions are typically designed to function with differential signals having a crossing point at or near a midpoint between a maximum and minimum voltage of the input signals. Such a constraint can arise as differential pair based comparators typically operate within a finite common-mode voltage range.

Differential signals can take various forms, and can include "latched" differential signals. Latched differential signals can be two signals that vary between a maximum signal value and minimum signal value in the same general time frame. Thus, at the time one signal transitions from high-to-low, the other signal can be transitioning from low-to-high.

In some cases, latched differential signals can have crossing points near either the minimum or maximum signal value. Examples of such signal crossings are shown in FIGS. 13A and 13B. Both FIGS. 13A and 13B are timing diagrams showing two signals VIN+ and VIN− that can vary between a maximum voltage $V_{HIGH}$ and a minimum voltage $V_{LOW}$. FIG. 13A shows a signal crossing point close a minimum voltage $V_{LOW}$. FIG. 13B shows a signal crossing point close to a maximum voltage $V_{HIGH}$.

When differential signals have such low or high crossing points, the signals can be outside the input voltage range of a conventional differential pair based comparator input as they drive to either the positive or negative supply voltages. In addition, such signals may not exhibit sufficient differential voltage to fully switch output states (high, low) of a conventional differential to single ended signal converter.

One type of circuit that can generate latched differential signals can be a particular class of oscillators that generate differential oscillating signals via a pair of cross-coupled latches. Such latches are typically have a NAND or NOR latch configuration. In particular, n-type field effect transistor (NFET) or p-type field effect transistor (PFET) logic implementations of a NAND or NOR latch oscillator architecture can generate latched differential output signals, such as those shown in FIGS. 13A and 13B. In such arrangements, $V_{HIGH}$ can be a positive supply voltage and/or max swing voltage and $V_{LOW}$ can be a negative supply voltage and/or minimum swing voltage.

Example delay cells that can be used in oscillator circuits are shown in U.S. patent application Ser. No. 11/415,588, filed on May 1, 2006, titled VOLTAGE CONTROLLED OSCILLATOR DELAY CELL AND METHOD by Sividasan et al.

Conventional differential to single ended solutions that rely on differential sensing may not be suitable for use with latched differential signals like those described above. In particular, as noted above, attempts to convert such latched differential signals may not work due to the common-mode input voltage being out of range. In addition, when such circuits do detect a change in such differential input signals, errors in determining the correct switching point can occur, resulting in duty cycle distortion and/or conversion timing jitter in the corresponding single ended output signal.

DETAILED DESCRIPTION

Various embodiments of the present invention will now be described in detail with reference to a number of drawings. The embodiments show circuits that can convert differential input signals to a single ended output signal.

Figure 1:
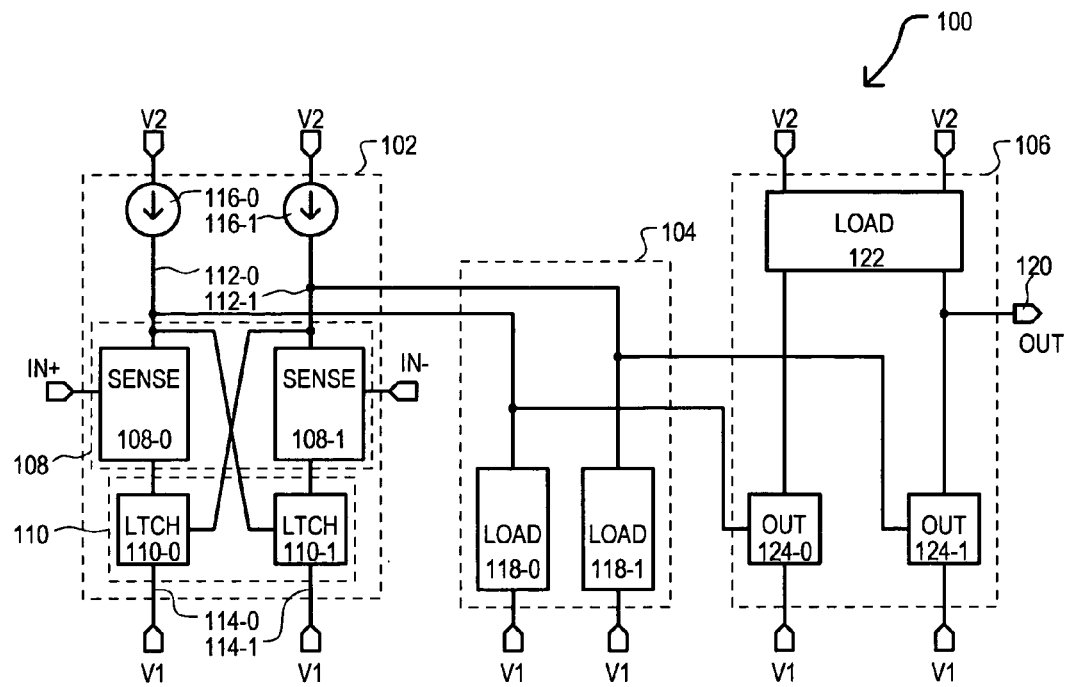
FIG. 1 is a block schematic diagram of a differential-to-single ended converter circuit according to a first embodiment of the present invention.

A differential to single ended conversion circuit according to a first embodiment is shown in block schematic diagram in FIG. 1, and designated by the general reference character 100. A circuit 100 can receive an input that includes a first differential input signal IN+ and a second differential input signal IN−, and can provide a single ended output signal OUT.

A circuit 100 can include an input section 102, a load section 104, and an output section 106. An input section 102 can latch opposite states based on differential input signals.

In the particular example of FIG. 1, an input section 102 can include a differential sense section 108 and a latching section 110. A differential sense section 108 can include a first sense device 108-0 and a second sense device 108-1. Sense devices (108-0 and 108-1) can be active device, such as transistors, that can provide a controllable impedance path (e.g., source-drain, collector-emitter) according to a control terminal (e.g., gate or base). Sense device 108-0 can receive first input signal IN+ at a control terminal. In response to such an input signal, sense device 108-0 can alter a potential at a first node 112-0. In a similar fashion, sense device 108-1 can alter a potential at a second node 112-1 in response to input signal IN− at its corresponding control terminal.

A latching section 110 can include first and second latching devices 110-0 and 110-1 that can include controllable impedance paths that vary according to corresponding control terminals. Latching devices (110-0 and 110-1) can be connected to one another in a "cross-coupled" fashion. In particular, the control terminal of one latching device is connected to the controllable impedance path of the other latching device, and vice versa. In such an arrangement, when a potential and/or current flow difference between first and second nodes (112-0 and 112-1) exceeds a certain amount, latching section 110 can latch first and second nodes (112-0 and 112-1) at opposite states. Latching devices (110-0 and 110-1) can be connected to a first power supply voltage V1 by separate current paths 114-0 and 114-1, respectively.

Input section 102 can also include current sources 116-0 and 116-1. A current source 106-0 can be connected between a second power supply voltage V2 and a first node 112-0. In a similar fashion, a current source 112-1 can be connected through a second power supply voltage V2 and a second node 112-1.

It is noted that an input section 102, unlike conventional delay stages mentioned above, does not provide current steering through a single current source/sink path. That is, by providing separate current paths (114-0 and 114-1), an input section can provide an advantageous switching operation. Even more particularly, an input section can be constructed to operate in either a "NOR" fashion or a "NAND" fashion. In a NOR configuration, both first and second sense devices (108-0 and 108-1) can conduct essentially no current up to a crossing point of input signals IN+ and IN−. At, or very close to a crossing point, one sense device can be turned on, causing a latching state to switch. In a similar fashion, in a NAND configuration, both first and second sense devices (108-0 and 108-1) can be conducting current up until a crossing point of input signals IN+ and IN−. At, or very close to a crossing point, one sense device can be turned off, causing a latching state to switch. Very specific examples of NOR and NAND configurations will be described in more detail below.

A load section 104 can provide loads for first and second nodes (112-0 and 112-1). In the example of FIG. 1, a load section 104 can include load devices 118-0 and 118-1. Load device 118-0 can be connected between first node 112-0 and a power supply voltage, while load device 118-1 can be connected between second node 112-1 and the same power supply voltage. In the very particular example shown, load devices (118-0 and 118-1) are connected to a first power supply voltage V1. While load devices can be formed with passive circuit elements, preferably load devices (118-0 and 118-1) can include active circuit elements. For example, each load device can have a control terminal (e.g., gate, base) connected to its corresponding controllable impedance path (e.g., drain, collector).

An output section 106 can drive an output node 120 between a first power supply voltage V1 and a second power supply voltage V2 based on the latched potentials at first and second nodes (112-0 and 112-1). In the example of FIG. 1, an output section 106 can include a load circuit 122, a first output device 124-0, and a second output device 124-1. Output node 120 can be driven toward first power supply voltage V1 by operation of second output device 124-1, and pulled toward a second power supply voltage V2 by operation of a load circuit 122. Even more particularly, load circuit 122 can be an active load circuit having its impedance controlled according to a first output device 124-0. Thus, when first and second nodes (112-0 and 112-1) are latched at one state, first output device 124-0 can be enabled, causing load circuit 122 to provide a low impedance between output node 120 and second power supply voltage V2. At the same time, second output device 124-1 can be disabled. As a result, output node 120 can be driven to second power supply voltage V2. Conversely, when first and second nodes (112-0 and 112-1) are latched at a second state, first output device 124-0 can be disabled, causing load circuit 122 to provide a high impedance between output node 120 and second power supply voltage V2. At the same time, second output device 124-1 can be enabled, causing output node 120 can be driven to a first power supply voltage V1.

In this way, a differential-to-single ended conversion circuit can include an input section in which sense devices both remain on (i.e., low impedance) or off (i.e., high impedance) until a switching point of differential input signals is reached. In the case where both sense devices remain on, at or very near to the switching point, one sense device can turn off, causing a latching state to switch. In the case where both sense devices remain off, at or very near to the switching point, one sense device can turn on, causing a latching state to switch.

Figure 2A:
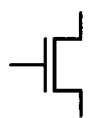
FIGS. 2A to FIG. 2F are circuit diagrams showing devices that can be used in the embodiment of FIG. 1.
Figure 2B:
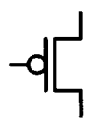
Figure 2C:
Figure 2D:
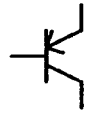
Figure 2E:
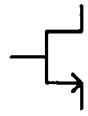
Figure 2F:
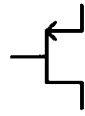

Referring now to FIGS. 2A to 2F, various devices that can be utilized in an embodiment like that of FIG. 1 are shown in symbolic form. FIGS. 2A and 2B show insulated gate field effect transistors (IGFETs) of complementary conductivity types (i.e., n-channel and p-channel). FIGS. 2A and 2B do not show body connections for such transistors, but it is understood that bodies of such devices can be connected to voltage levels suitable for a desired performance. FIGS. 2C and 2D show bipolar transistors of opposite conductivity types (i.e., npn and pnp). FIGS. 2E and 2F shown junction FETs (JFETs) of complementary conductivity types (i.e., n-channel and p-channel).

Such transistors can form all, or selected portions of a circuit like that of FIG. 1. As but a few examples, sense devices (108-0 and 108-1) and latch devices (110-0 and 110-1) can be transistors of the same type and conductivity.

Similarly, load devices (118-0 and 118-1) can be FETs of the same conductivity type having their gates connected to their respective drains, or bipolar transistors of the same conductivity type having bases connected to collectors.

Within an output section 106, a load circuit 122 can include output devices (124-0 and 124-1) of the same type and conductivity. In particular arrangements, a load circuit 122 can be current mirror circuit by transistors of the same type, but opposite conductivity to output devices (124-0 and 124-1).

It is understood that different sections can be formed with different device types, or the same device types.

In this way, a differential-to-single ended converter circuit can be formed from various types of active devices, including but not limited to IGFETs, bipolar transistors and/or JFETs.

Figure 3:
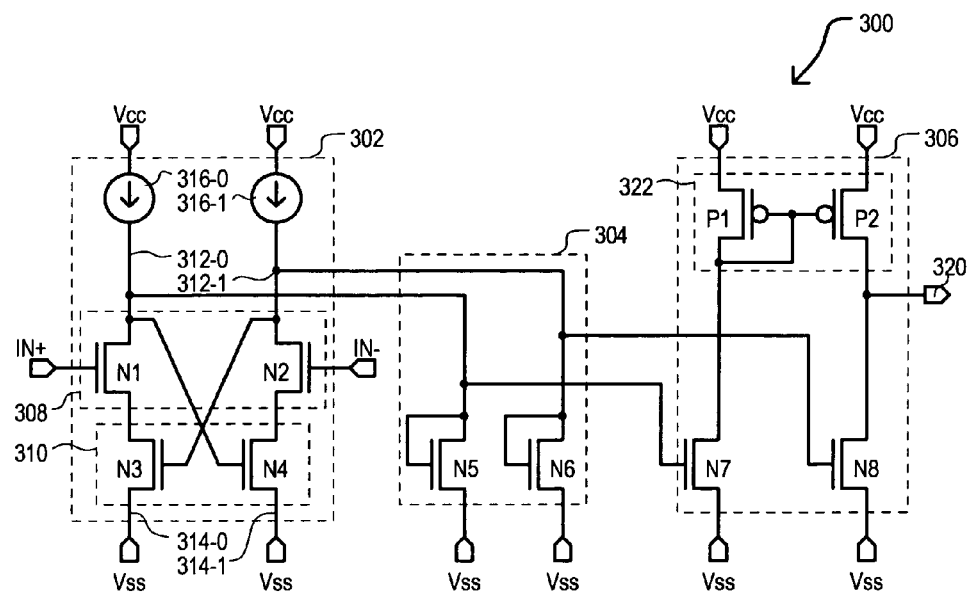
FIG. 3 is a schematic diagram of a NAND type differential-to-single ended converter circuit according to a second embodiment of the present invention.

Referring now to FIG. 3, a latched differential-to-single ended signal converter circuit according to a second embodiment is shown in schematic diagram, and designated by the general reference character 300. A circuit 300 can include some of the same general sections as FIG. 1, thus like sections are referred to by the same reference character, but with the first digit being a "3" instead of a "1".

FIG. 3 shows an arrangement in that can receive a potentially problematic latched differential signal (differential signals whose crossing point is very close to a maximum signal voltage) and convert it into a single-ended full swing logic signal with nearly the same duty cycle as the differential signal. That is, when latched differential signals having crossing points with essentially 50% duty cycles, a circuit 300 can provide a resulting output signal with a corresponding 50% duty cycle.

The circuit 300 FIG. 3 shows an example of a "NAND" type arrangement. An input section 302 can include a differential sense section 308 formed with two n-channel IGFETs N1 and N2, and latching section 308 formed with two n-channel IGFETs N3 and N4. Sense transistor N1 can have a gate connected to receive a first input signal IN+ and a source-drain path arranged in series with latching transistor N3 between first node 312-0 and a low power supply voltage Vss. Similarly, sense transistor N2 can have a gate connected to receive a second input signal IN− and a source-drain path arranged in series with latching transistor N4 between a second node 312-1 and low power supply voltage Vss.

Cross coupling of devices within latching section 310 can include latch transistor N3 having a gate connected to second node 312-1, and latch transistor N4 having a gate connected to first node 312-0.

A load section 304 can include a first and second load n-channel IGFETs N5 and N6 each in a "diode" configuration (gate connected to drain). Transistor N5 can have a gate and drain connected to first node 312-0 and a source connected to a low power supply voltage Vss. Transistor N6 can have a gate and drain connected to second node 312-1 and a source connected to a low power supply voltage Vss.

Output section 306 includes first output n-channel IGFET N7 and second output n-channel IGFET N8 and load circuit 322. Load circuit 322 can be a current mirror formed by p-channel IGFETs P1 and P2. In particular, transistor P1 can have a source-drain-path connected between a high power supply voltage Vcc and a source-drain path of transistor N7, and a gate connected to its drain and to a gate of transistor P2. Transistor P2 can have a source-drain path between a high power supply voltage Vcc and a source-drain path of transistor N8.

The embodiment of FIG. 3 can utilize differential input signals to steer current into load devices (N5 and N6). Currents drawn by such load devices (N5 and N6) can be mirrored in different legs of output section 306 (a leg formed by source-drain paths of P1/N7, and a leg formed by source-drain paths of P2/N8). However, such an arrangement does not steer a current via a differential pair of transistors, but can be conceptualized as "stealing" current via a NAND latch formed by transistors N1 to N4. An advantage of such a latching arrangement can be that a latched differential signal has a crossing point very close to its maximum voltage, and current steering can not be completed near the crossing point of such signals because both sense transistors (N1 and N2) are conducting current. Therefore, a latch operation of latching transistors (N3 and N4) can hold a current state until one of the sense transistors is switched "off".

In this way, when a crossing point for differential input signals (IN+/IN−) is near a maximum value for such signals, sense transistors (N1 and N2) can be on simultaneously, but due to the cross-coupled configuration of latching devices (N3 and N4), a single switching operation can be generated at first and second nodes (312-0 and 312-1) when one such transistor is turned off.

Figure 4:
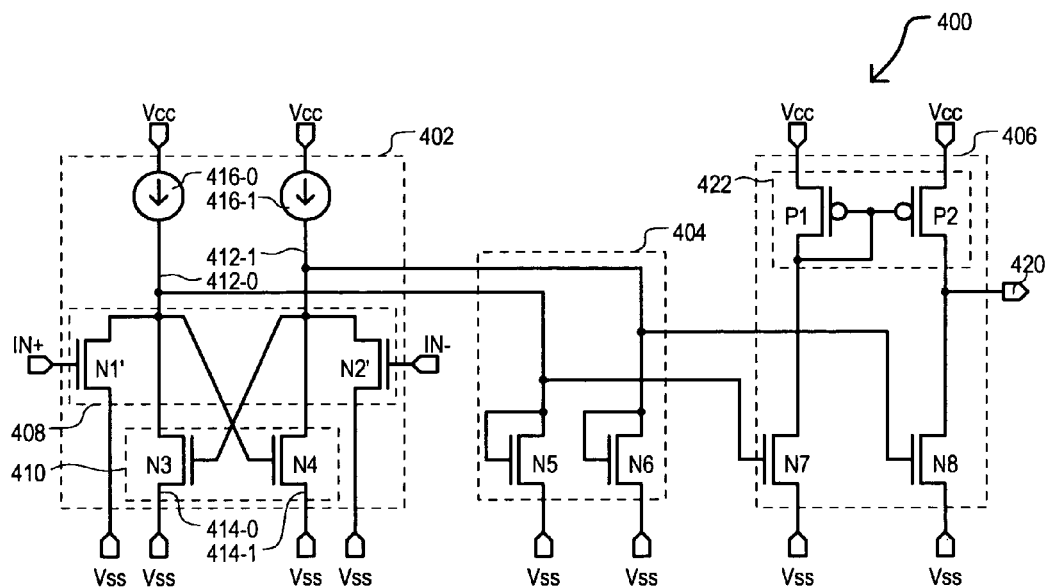
FIG. 4 is a schematic diagram of a NOR type differential-to-single ended converter circuit according to another embodiment of the present invention.

Referring now to FIG. 4, another differential-to-single ended converter is shown in a schematic diagram. As in the case of the embodiment of FIG. 3, the circuit of FIG. 4 can receive a potentially problematic latched differential signal (in this case one whose crossing point is very close to a minimum signal voltage) and convert it into a single-ended full swing logic signal with nearly the same duty cycle as the differential signal. A circuit 400 can include many of the same general sections as FIG. 3, thus like sections are referred to by the same reference character, but with the first digit being a "4" instead of a "3".

The circuit 400 FIG. 4 shows an example of a "NOR" type arrangement. An input section 402 can include a differential sense section 408 formed with two n-channel IGFETs N1' and N2', and latching section 410 formed with two n-channel IGFETs N3 and N4. However, unlike the arrangement of FIG. 3, sense transistor N1' can have a source-drain path arranged in parallel with latching transistor N3 between first node 412-0 and a low power supply voltage Vss. Similarly, sense transistor N2' can have a source-drain path arranged in parallel with latching transistor N4 between a second node 412-1 and low power supply voltage Vss.

In the very particular example of FIG. 4, load section 404 and output section 406 can be same as that of FIG. 3.

As in the embodiment of FIG. 3, a NOR latch formed by transistors N1' to N4 can be conceptualized as "stealing" current provided by operation of sense transistors N1' and N2'. An advantage of such a latching arrangement can be that a latched differential signal has a crossing point very close to its minimum voltage, and current steering is not completed near the crossing point of such signals because both sense transistors (N1' and N2') are not conducting current. Therefore, a latch operation of latching transistors (N3 and N4) can hold a current state until one of the sense transistors is switched "on".

In this way, when a crossing point for differential input signals (IN+/IN−) is near a minimum value for such signals, sense transistors (N1 and N2) can be off simultaneously, but due to the cross-coupled configuration of latching devices (N3 and N4), a single switching operation can be generated at first and second nodes (412-0 and 412-1).

The embodiments described above can provide conversion between differential input signals to a single ended full swing output signal by steering current to load devices (e.g., 118-0/118-1, N5/N6) in order to produce near 50% duty cycle output.

While the above embodiments have shown differential-to-single ended conversion circuits, the present invention can also include other circuit arrangements. Two particular examples of such circuits will now be described with reference to FIGS. 5 and 6.

Figure 5:
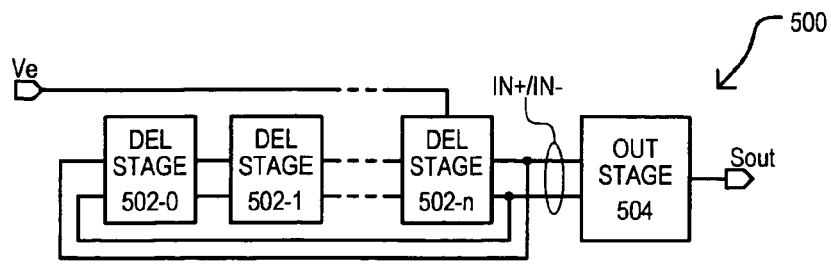
FIG. 5 is a block schematic diagram of a ring type oscillator circuit according to an embodiment.

Referring now to FIG. 5, an oscillator circuit according to another embodiment is shown in a block schematic diagram and designated by the general reference character 500. An oscillator circuit can be a ring type oscillator circuit that includes an odd number of delay stages 502-0 to 502-*n* arranged into a ring. Each delay stage (502-0 to 502-*n*) can receive differential input signals, and delay such signals to generate differential output signals for a next stage in the ring. In the particular example of FIG. 5, each delay stage (502-0 to 502-*n*) can have a delay controlled according to a control voltage Ve.

However, unlike conventional ring oscillator circuits, the embodiment of FIG. 5 can also include an output stage 504. An output stage 504 can convert an oscillating differential signal generated by delay stages (502-0 to 502-n) into a single ended signal that varies between two voltage levels (e.g., V1/V2, Vcc/Vss). In such an arrangement, even if differential signals have a cross over point that is near a maximum or minimum input signal level, an output signal can be generated that is accurate and can provide a 50% duty cycle. More particularly, if oscillator differential signals have high cross over point (e.g., near maximum level), an output stage 504 can be a latching NAND type differential-to-single ended converter signal, like those described herein. If oscillator differential signals have a low cross over point (e.g., near minimum level), an output stage 504 can be a latching NOR type differential-to-single ended converter signal like those described herein.

It is noted that an output stage (e.g., 504) is preferably utilized with a VCO that generates differential signals having high or low crossing points, as noted above. While the embodiments above can accept differential signals with center voltage crossing points, such arrangements may suffer from inaccuracy and/or duty cycle distortion.

In this way, a ring oscillator can include a latching differential to single ended converter to generate a single ended output signal, even if the oscillator operates with differential signals that cross near a maximum or minimum signal level.

Figure 6:
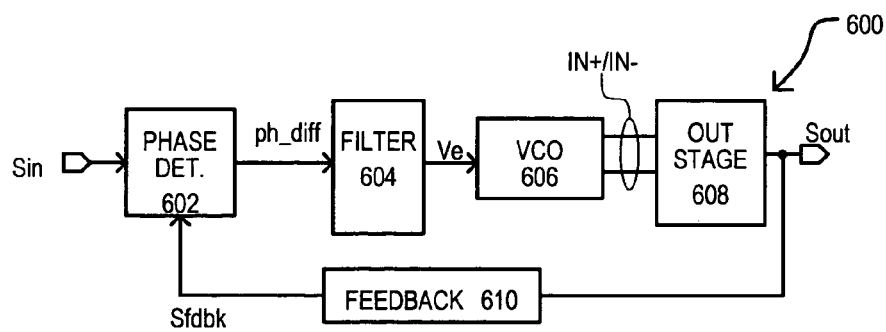
FIG. 6 is a block schematic diagram of a phase lock loop (PLL) circuit according to an embodiment.

Referring now to FIG. 6, a phase locked loop (PLL) circuit according to a fifth embodiment is shown in a block schematic diagram and designated by the general reference character 600. A PLL 600 can include a phase detector 602, a filter section 604, a voltage controlled oscillator (VCO) 606, an output stage 608, and a feedback path 610. A phase detector 602 can receive an input signal Sin and a feedback signal Sfdbk, and determine a phase difference between such values ph_diff. A phase difference value ph_diff can be filtered by a filter section to generate a control voltage Ve. A VCO 606 can be a ring oscillator that generates a differential signal IN+/IN− whose output frequency can vary according to control voltage Ve. As but one example, a VCO can be a ring oscillator signal like that shown as 500 in FIG. 5.

Referring still to FIG. 6, output stage 608 can receive differential input signals IN+/IN−, and in response thereto, generate a single ended output signal Sout. An output stage 608, like that shown as 504 in FIG. 5, can be a latching NAND type differential-to-single ended converter signal or a latching NOR type differential-to-single ended converter signal, including any of the embodiments shown in FIG. 1, 3 or 4, or variations of such circuits noted herein.

A feedback path 610 can couple output signal Sout back to phase detector 602 as feedback signal Sfdbk. According to the particular PLL application, a feedback path 610 may also include a frequency divider or multiplier.

In this way, a PLL circuit can include a latching differential to single ended converter to generate an output signal from a VCO that generates differential input signals.

Advantages of the improved solution include that it can be suitable for differential to single ended signal conversion for a latched voltage controlled oscillator architecture and provide a near 50% output duty cycle. Conventional differential comparator architectures, typically used for differential delay cell voltage controlled oscillators, may not be suitable due to the either high or low voltage crossing points for the latched differential output signals and the small differential input voltage at the differential input crossing point.

Figure 7:
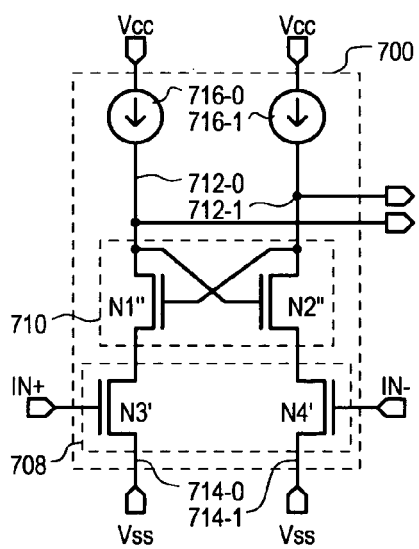
FIG. 7 is a schematic diagram of an NMOS NAND input section according to an embodiment.

Referring now to FIGS. 7 to 12, various alternate embodiments will now be described. FIG. 7 shows a first alternate NAND type input section 700. Such an input section can be used in place other input sections described above, for example, in place of input section 302 shown in FIG. 3. A NAND type input section 700 can include the same general circuit components of the input section shown as 302 in FIG. 3. Unlike the arrangement of FIG. 3, positions of sense devices (N3' and N4') and latching devices (N1" and N2") can be reversed. Thus, sense devices (N3' and N4') can have source-drain paths connected to a low power supply voltage Vss, while latching devices (N1" and N2") can have source-drain paths directly connected to first and second nodes 712-0 and 712-1.

Figure 8:
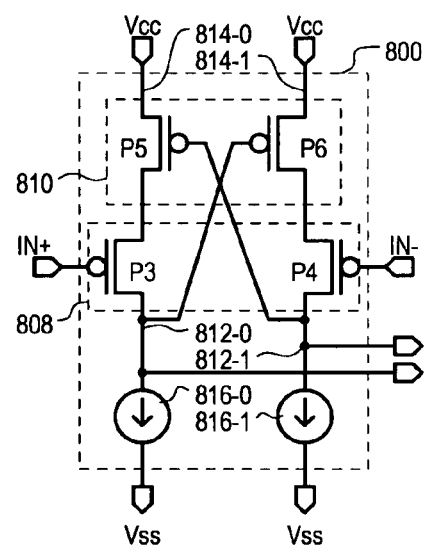
FIG. 8 is a schematic diagram of a PMOS NAND input section according to an embodiment.

Referring now to FIG. 8, another alternate NAND type input section is designated by the general reference character 800. Such an input section can be used in place other input sections described above. A NAND type input section 800 can have the same general configuration as that shown as 302 in FIG. 3. Unlike the arrangement of FIG. 3, sense devices (P3 and P4) and latching devices (P5 and P6) can be p-channel IGFETs.

Figure 9:
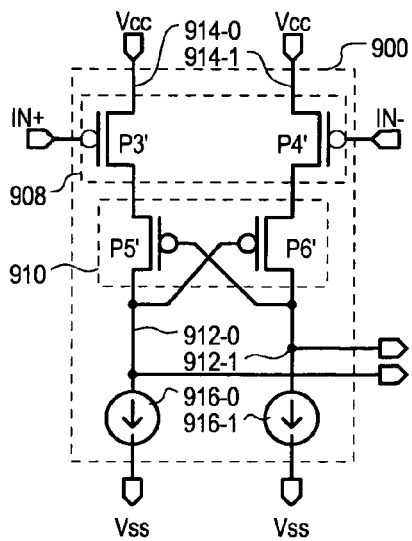
FIG. 9 is a schematic diagram of a PMOS NAND input section according to an embodiment.

FIG. 9 shows a NAND type input section having the same general construction as that of FIG. 7, but with p-channel IGFETs.

Figure 10:
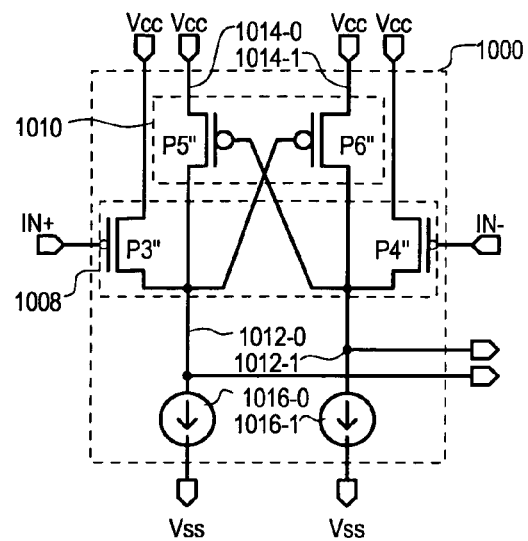
FIG. 10 is a schematic diagram of a PMOS NOR input section according to an embodiment.

Referring now to FIG. 10, an alternate NOR type input section is designated by the general reference character 1000. Such an input section can be used in place other input sections described above. A NOR type input section 1000 can have the same general configuration as that shown as 402 in FIG. 4. Unlike the arrangement of FIG. 4, sense devices (P3" and P4") and latching devices (P5" and P6") can be p-channel IGFETs.

Figure 11:
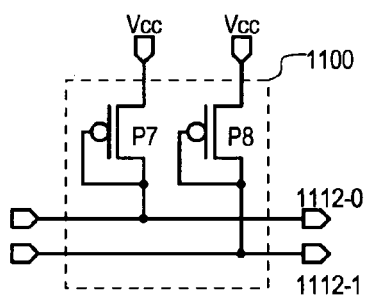
FIG. 11 is a schematic diagram of a load section according to an embodiment.

Referring now to FIG. 11, an alternate load section is designated by the general reference character 1100. A load section 1100 can have the same general configuration as that shown as 304 in FIG. 3. Unlike the arrangement of FIG. 3, load devices (P7 and P8) can be p-channel IGFETs. Preferably, a load section 1100 can be utilized in combination with input sections having p-channel devices, like those shown in FIGS. 8-10.

Figure 12:
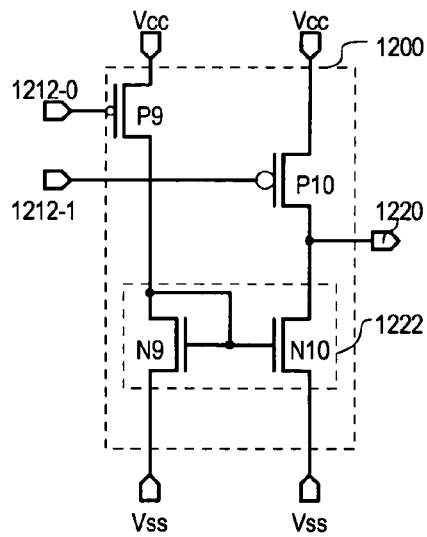
FIG. 12 is a schematic diagram of an output section according to an embodiment.
Figure 13A:
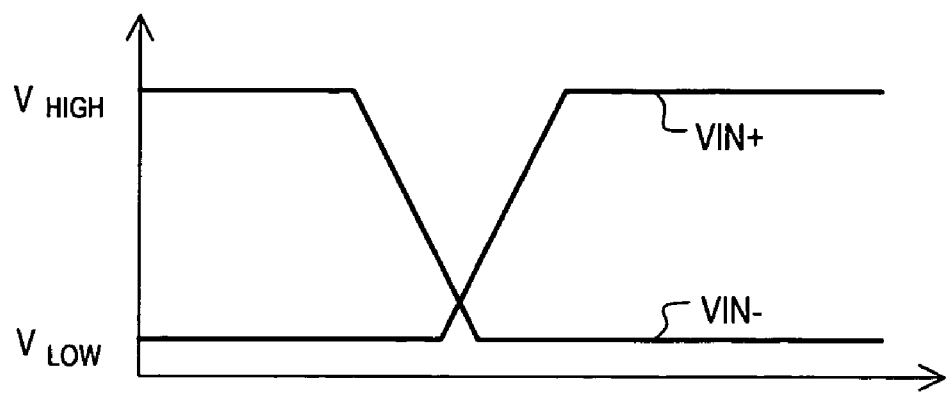
FIGS. 13A and 13B are waveforms showing differential latched input signals.
Figure 13B:
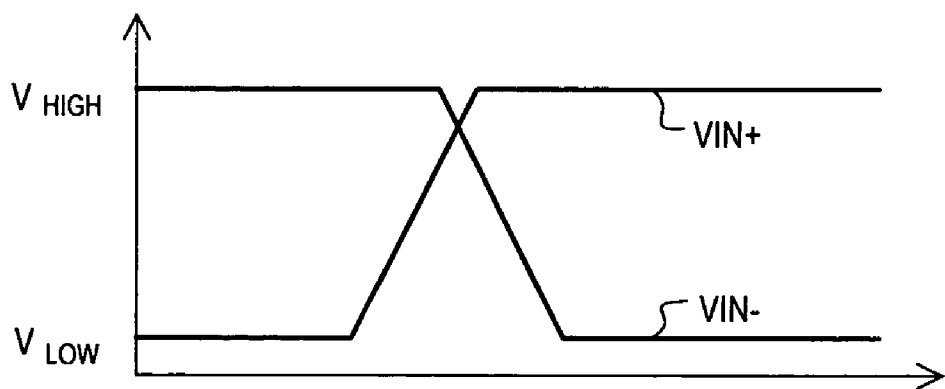

Referring now to FIG. 12, an alternate output section is designated by the general reference character 1200. Output section 1200 can have the same general configuration as that shown as 306 in FIG. 3. Unlike the arrangement of FIG. 3, output devices P9 and P10 can be p-channel IGFETs, while load circuit 1222 can be formed from n-channel IGFETs.

Of course, the various circuit sections described in the various embodiments can include n-channel JFETs in place of n-channel IGFETs and p-channel JFETs in place of p-channel IGFETs. Similarly, alternate embodiments can also include npn bipolar transistors in place of n-channel IGFETs, and pnp bipolar transistors in place of p-channel IGFETs.

For purposes of clarity, many of the details of the embodiments that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is understood that the embodiments of the invention may be practiced in the absence of an element and or step not specifically disclosed. That is, an inventive feature of the invention can be elimination of an element.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A differential-to-single ended converter circuit, comprising:
   an input section that includes:
      an input differential transistor pair including a first input transistor having a control terminal coupled to a first differential input and a controllable impedance path coupled to a first detect node, and a second input transistor having a control terminal coupled to a second differential input and a controllable impedance path coupled to a second detect node;
      a first current path and a second current path separate from the first current path;
      a latching transistor pair including a first latch transistor and a second latch transistor,
      the first latch transistor having a control terminal coupled to the second detect node, the first latch transistor including a controllable impedance path coupled between the first current path and the first detect node only through the controllable impedance path of the first input transistor, wherein the controllable impedance path of the first latch transistor extends to a first power supply potential node via said first current path only to apply the first power supply potential directly to the controllable impedance path of the first latch transistor, and
      the second latch transistor having a control terminal coupled to the first detect node, the second latch transistor including a controllable impedance path coupled between the second current path and the second detect node only through the controllable impedance path of the second input transistor, wherein the controllable impedance path of the second latch transistor extends to the first power supply potential node via said second current path only to apply the first power supply potential directly to the controllable impedance path of the second latch transistor; and
      an output stage that enables and disables impedance paths between an output node and the first power supply node and a second power supply node according to the potentials at the first detect node and the second detect node.

2. The differential-to-single ended converter circuit of claim 1, wherein:
   the controllable impedance path of the first input transistor is coupled in series with the controllable impedance path of the first latch transistor; and
   the controllable impedance path of the second input transistor is coupled in series with the controllable impedance path of the second latch transistor.

3. The differential-to-single ended converter circuit of claim 1, wherein:
   the controllable impedance path of the first input transistor is coupled in parallel with the controllable impedance path of the first latch transistor; and
   the controllable impedance path of the second input transistor is coupled in parallel with the controllable impedance path of the second latch transistor.

4. The differential-to-single ended converter circuit of claim 1, wherein:
   the first input transistor, second input transistor, first latch transistor, and second latch transistor comprise transistors of the same conductivity type.

5. The differential-to-single ended converter circuit of claim 1, wherein:
   the first latch transistor and second latch transistor are selected from a group consisting of n-channel insulated gate field effect transistors (IGFETs) and p-channel IGFETs.

6. The differential-to-single ended converter circuit of claim 1, wherein:
   the first and second latch transistors are selected from a group consisting of insulated gate field effect transistors, bipolar transistors: and junction field effect transistors.

7. The differential-to-single ended converter circuit of claim 1, further including:
   a first output transistor having a controllable impedance path coupled between the output node and the first power supply node, and a control terminal coupled to the first detect node.

8. The differential-to-single ended converter circuit of claim 7, further comprising:
   a load circuit having a first load impedance coupled between the second power supply node and the controllable impedance path of the first output transistor.

9. The differential-to-single ended converter circuit of claim 8, wherein the load circuit includes a current mirror circuit comprising:
   a first mirror transistor with a controllable impedance path coupled between the output node and the second power supply node,
   a second mirror transistor with a controllable impedance path coupled to the second power supply node and a control terminal coupled to a control terminal of the first mirror transistor; and
   a second output transistor having a controllable impedance path coupled between the second mirror transistor and the first power supply node, and a control terminal coupled to the second detect node.

10. The differential-to-single ended converter circuit of claim 1, further including:
    a first detect load device that provides an impedance between the first detect node and the first power supply node; and
    a second detect load device that provides an impedance between the second detect node and the first power supply node.

11. The differential-to-single ended converter circuit of claim 10, wherein:

the first detect load device and second detect load device both comprise transistors having control terminals coupled to their respective controllable impedance paths.

12. The differential-to-single ended converter circuit of claim 1, further comprising:
a plurality of delay stages arranged in series with one another including an output delay stage that outputs a dual signal differential voltage as inputs to the first and second differential inputs.

13. The differential-to-single ended converter circuit of claim 12, wherein:
the plurality of delay stages are coupled in a ring to form a ring oscillator, at least one delay stage having a delay controlled according to a control voltage; and
a phase detector having a first input coupled to receive an input signal and a second input coupled to receive a feedback signal, the phase detector providing a phase difference value corresponding to a difference in phase between the input signal and the feedback signal;
a control voltage generator that generates the control voltage based on the phase difference value; and
a feedback path coupled between the output node and the second input of the phase detector.

14. The differential-to-single ended converter circuit of claim 1, further including:
a first current source coupled between the second power supply node and the controllable impedance path of the first input transistor; and
a second current source coupled between the second power supply node and the controllable impedance path of the second input transistor.

* * * * *